(12) United States Patent
Ueno et al.

(10) Patent No.: US 10,374,031 B2
(45) Date of Patent: Aug. 6, 2019

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Katsunori Ueno, Matsumoto (JP); Shinya Takashima, Hachioji (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 5 days.

(21) Appl. No.: 15/836,931

(22) Filed: Dec. 11, 2017

(65) Prior Publication Data

US 2018/0175138 A1    Jun. 21, 2018

(30) Foreign Application Priority Data

Dec. 21, 2016  (JP) .................................. 2016-248499
Mar. 8, 2017   (JP) .................................. 2017-044053

(51) Int. Cl.
*H01L 21/04* (2006.01)
*H01L 29/417* (2006.01)
(Continued)

(52) U.S. Cl.
CPC .......... *H01L 29/063* (2013.01); *H01L 21/046* (2013.01); *H01L 29/045* (2013.01);
(Continued)

(58) Field of Classification Search
CPC ... H01L 21/046; H01L 29/045; H01L 29/063; H01L 29/0878; H01L 29/1037; H01L 29/1095; H01L 29/1608; H01L 29/41766; H01L 29/7827
See application file for complete search history.

(56) References Cited

U.S. PATENT DOCUMENTS 6,160,288 A * 12/2000 Yamada .............. H01L 29/7813
                                                       257/330
7,345,342 B2 *  3/2008 Challa ................. H01L 21/3065
                                                       257/341
(Continued)

FOREIGN PATENT DOCUMENTS

JP    2007-529115 A    10/2007
JP    2012-178536 A     9/2012
JP    2015-026723 A     2/2015

OTHER PUBLICATIONS

Tohru Oka et al., Vertical GaN-based trench metal oxide semiconductor field-effect transistors on a free-standing an substrate with blocking voltage of 1.6 kV, Jan. 28, 2014, Applied Physics Express, vol. 7, 021002-1~21002-3.

*Primary Examiner* — Joseph M Galvin, III

(57) ABSTRACT

Provided is a semiconductor device including at least two isolation trench portions; a mesa region that is provided between the at least two isolation trench portions and includes a source region having a first conduction type, a base region having a second conduction type and at least a portion thereof provided below the source region, and a gate trench portion; and a contact layer that is an epitaxial layer provided at least in contact with side portions of the mesa region and bottom portions of the isolation trench portions positioned lower than the gate trench portion, and having a second-conduction-type impurity concentration higher than that of the base region, wherein the same impurities as in the contact layer are present in the source region, or the contact layer is provided higher than the source region.

13 Claims, 13 Drawing Sheets

(51) Int. Cl.
*H01L 29/10* (2006.01)
*H01L 29/06* (2006.01)
*H01L 29/04* (2006.01)
*H01L 29/16* (2006.01)
*H01L 29/78* (2006.01)
*H01L 29/08* (2006.01)

(52) U.S. Cl.
CPC ...... *H01L 29/0878* (2013.01); *H01L 29/1037* (2013.01); *H01L 29/1095* (2013.01); *H01L 29/1608* (2013.01); *H01L 29/41766* (2013.01); *H01L 29/7827* (2013.01)

(56) References Cited

U.S. PATENT DOCUMENTS

| | | | |
|---|---|---|---|
| 7,411,266 B2* | 8/2008 | Tu | H01L 29/0634 257/492 |
| 7,682,889 B2* | 3/2010 | Peake | H01L 29/0847 438/192 |
| 7,858,478 B2* | 12/2010 | Hirler | H01L 21/2815 438/270 |
| 9,082,815 B2* | 7/2015 | Sugimoto | H01L 29/7397 |
| 2011/0254084 A1* | 10/2011 | Terrill | H01L 29/407 257/330 |
| 2013/0306983 A1 | 11/2013 | Nakano et al. | |
| 2014/0097517 A1* | 4/2014 | Moens | H01L 29/36 257/607 |
| 2015/0340514 A1* | 11/2015 | Disney | H01L 29/66446 257/76 |
| 2015/0349057 A1* | 12/2015 | Nakano | H01L 29/0623 257/331 |
| 2016/0163853 A1 | 6/2016 | Hiyoshi et al. | |

* cited by examiner

SEMICONDUCTOR DEVICE AND MANUFACTURING METHOD OF SEMICONDUCTOR DEVICE

BACKGROUND

1. Technical Field

The present invention relates to a semiconductor device and a method of manufacturing the semiconductor device.

2. Related Art

Conventional technology is known for providing a gate trench portion in a mesa region, as shown in Non-Patent Document 1, for example. Furthermore, technology is known for, when implanting p-type impurities in a bottom portion of a valley between mesa regions, also implanting p-type impurities in the side portions of the mesa regions, as shown in Patent Document 1, for example.

Non-Patent Document 1: Tohru Oka et al., Vertical GaN-based trench metal oxide semiconductor field-effect transistors on a free-standing GaN substrate with blocking voltage of 1.6 kV, Jan. 28, 2014, Applied Physics Express, volume 7, 021002

Patent Document 1: Japanese Patent Application Publication No. 2012-178536

In order to improve the withstand voltage of a semiconductor device when the gate is OFF, it is preferable to provide a $p^+$-type layer in contact with the side portions of the mesa regions provided in the gate trench portions and the bottom portion of the valleys between these mesa regions.

SUMMARY

According to a first aspect of the present invention, provided is a semiconductor device. The semiconductor device may comprise at least two isolation trench portions, a mesa region, and a contact layer. The mesa region may be provided between the at least two isolation trench portions. The mesa region may include a source region having a first conduction type, a base region having a second conduction type, and a gate trench portion. The base region having the second conduction type may have at least a portion thereof provided below the source region. The contact layer may be provided at least in contact with side portions of the mesa region and bottom portions of the isolation trench portions. The bottom portions of the isolation trench portions may be positioned lower than the gate trench portion. The contact layer may have a second-conduction-type impurity concentration higher than that of the base region. The same impurities as in the contact layer are present in the source region, or instead the contact layer is provided higher than the source region.

If the same impurities as in the contact layer are present in the source region, the second-conduction-type impurity concentration in the source region and the second-conduction-type impurity concentration in the contact layer provided in contact with the bottom portions of the isolation trench portions may be the same The base region may be provided covering corner portions positioned at bottom ends of the side portions of the gate trench portion in contact with the base region.

The base region may have a tail region in which the impurity concentration of impurities with a first conduction type, which is the same conduction type as the impurities of the source region, gradually decreases in a depth direction of the gate trench portion.

If the contact layer is provided on the source region, the semiconductor device may further comprise a source electrode penetrating through the contact layer to contact the source region. The source electrode may have at least a portion thereof provided on the contact layer that is provided on the mesa region.

The second-conduction-type impurity concentration of the contact layer provided on the side portions of the mesa region and the second-conduction-type impurity concentration of the contact layer provided in contact with the bottom portions of the isolation trench portions may be the same.

Instead, the second-conduction-type impurity concentration of the contact layer provided on the side portions of the mesa region may be higher than the second-conduction-type impurity concentration of the contact layer provided in contact with the bottom portions of the isolation trench portions.

The contact layer may have an opening on the source region. The contact layer may contact a top portion of the mesa region.

In a top view of the semiconductor device, an end portion of the opening of the contact layer may be positioned on a side end portion of the source region.

In a top view of the semiconductor device, a position of an end portion of the opening of the contact layer may match a position of a side end portion of the source region.

The mesa region and the contact layer may be formed of a GaN-based semiconductor material.

According to a second aspect of the present invention, provided is a method of manufacturing a semiconductor device. The method of manufacturing the semiconductor device may comprise epitaxially forming a base region; forming a mesa region; epitaxially forming a contact layer; and forming a gate trench portion. The epitaxially forming the base region may include epitaxially forming the base region with a second conduction type on a drift region with a first conduction type. The forming the mesa region may include forming the mesa region between at least two isolation trench portions, by partially etching the drift region and the base region. The epitaxially forming the contact layer may include epitaxially forming the contact layer that contacts a top portion of the mesa region, side portions of the mesa region, and bottom portions of the isolation trench portions, and has a second-conduction-type impurity concentration that is higher than that of the base region.

The method of manufacturing the semiconductor device may further comprise ion-implanting after the epitaxially forming the contact layer and before the forming the gate trench portion. The ion-implanting may include ion-implanting impurities with a first conduction type in a predetermined region of the contact layer provided on the top portion of the mesa region.

The method of manufacturing the semiconductor device may further comprise epitaxially forming a source region after the epitaxially forming the base region and before the forming the mesa region. The epitaxially forming the source region may include epitaxially forming the source region with a first conduction type on the base region The epitaxially forming the contact layer may be performed after the forming the mesa region and before the forming the gate trench portion. The method of manufacturing the semiconductor device may further comprise thermally treating the contact layer; forming an opening in the contact layer; and ion-implanting impurities with a first conduction type in the base region via at least the opening. The thermally treating the contact layer, may be after the epitaxially forming the contact layer and before the forming the gate trench portion. The forming the opening in the contact layer may be after the thermally treating the contact layer and before the forming the gate trench portion. The ion-implanting impurities with the first conduction type in the base region via at least the opening may be after the forming the opening in the contact layer and before the forming the gate trench portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
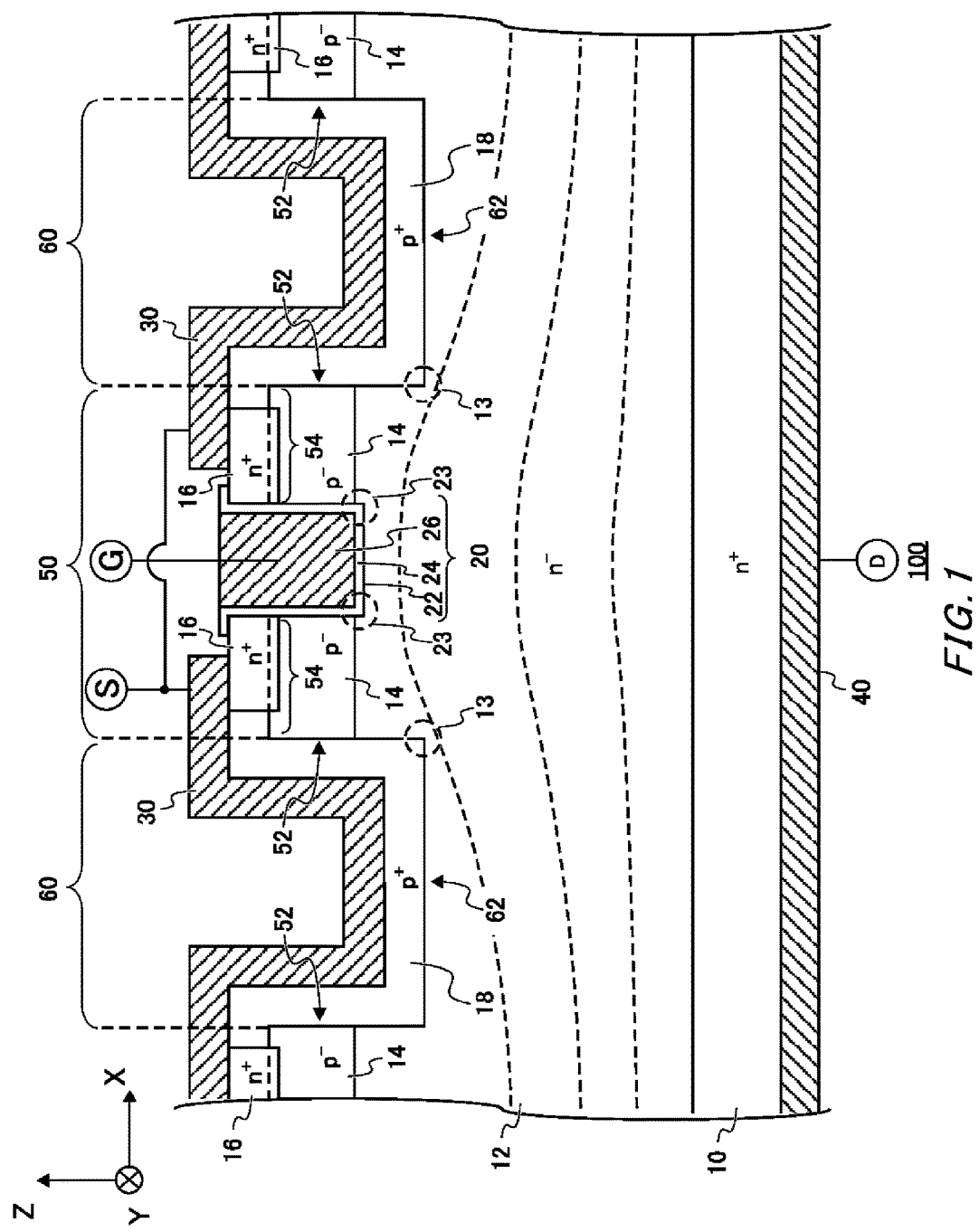
FIG. 1 is a cross-sectional view of a semiconductor device 100 according to a first embodiment.

FIG. 1 is a cross-sectional view of a semiconductor device 100 according to a first embodiment. The semiconductor device 100 of the present example is a semiconductor chip including a vertical MOSFET (Metal Oxide Semiconductor Field Effect Transistor). FIG. 1 is a cross-sectional view of essential portions of the vertical MOSFET. In order to make the drawing in FIG. 1 easier to understand, insulating films between the layers, wiring, and the like are omitted or simplified.

The essential portions of the vertical MOSFET shown in FIG. 1 may be repeated periodically in the X-axis direction. Furthermore, the essential portions of the vertical MOSFET may extend continuously in the Y-axis direction. In one example, the Y-axis direction is the extension direction of the mesa regions 50 and the isolation trench portions 60, and the X-axis direction is an arrangement direction in which the mesa regions 50 and the isolation trench portions 60 are arranged in an alternating manner.

In the present example, the X-axis direction and the Y-axis direction are perpendicular to each other, and the Z-axis direction is perpendicular to the X-Y plane. The X-axis direction, the Y-axis direction, and the Z-axis direction form a so-called right-handed system. In the present example, the positive Z-axis direction is sometimes referred to as "up" and the negative Z-axis direction is sometimes referred to as "down." Here, "up" and "down" are merely convenient expressions for identifying relative positional relationships among the substrate, regions, films, and the like. For example, the Z-axis direction does not necessarily mean a direction of gravity or a direction perpendicular to the ground.

The semiconductor material in the semiconductor device 100 may be a GaN (gallium nitride)-based semiconductor material. The GaN-based semiconductor material may be GaN that does not include Al (aluminum) and In (indium), or may be GaN that does include Al and In. In other words, the GaN-based semiconductor material may refer to $In_xAl_yGa_{(1-x-y)}N$, where $0 \leq x$ and $y<1$. It should be noted that the GaN-based semiconductor material in the present example is GaN, i.e. $In_xAl_yGa_{(1-x-y)}N$ in which $x=y=0$.

The semiconductor device 100 in the present example includes a substrate 10, a drift region 12, a base region 14, a source region 16, a contact layer 18, a gate trench portion 20, a source electrode 30, and a drain electrode 40. In the present example, the substrate 10, the drift region 12, the base region 14, the source region 16, and the contact layer 18 are formed of the GaN-based semiconductor material. Specifically, the substrate 10 is an $n^+$-type free-standing substrate. The drift region 12 is an $n^-$-type region epitaxially formed on the substrate 10. The base region 14 is a $p^-$-type region epitaxially formed on the drift region 12.

In the present example, an example is shown in which the first conduction type is n-type and the second conduction type is p-type, but instead the conduction types of the substrate, regions, layers, films, and the like may each be the opposite polarity. In other words, in another example, the first conduction type may be p-type and the second conduction type may be n-type. In the present example, "n" and "p" respectively mean that the majority of carriers are electrons and holes. Furthermore, concerning "+" and "−" written to the upper right of "n" and "p," "+" means that the carrier concentration is higher than in a case where "+" is not written and "−" means that the carrier concentration is lower than in a case where "−" is not written.

The semiconductor device 100 of the present example includes a mesa region 50 and isolation trench portions 60. The mesa region 50 may be provided between at least two isolation trench portions 60 that are adjacent in the X-axis direction. The isolation trench portions 60 are trench portions that are larger than the gate trench portion 20 in the X-axis, Y-axis, and Z-axis directions. In FIG. 1, the isolation trench portions 60 are regions where the base region 14 and part of the top portion of the drift region 12 have been cut away. Furthermore, the mesa region 50 is a region that remains after the isolation trench portions 60 have been formed. Therefore, the mesa region 50 includes the base region 14 and part of the top portion of the drift region 12.

The mesa region 50 of the present example has a rectangular convex shape. The mesa region 50 may include the base region 14, part of the $n^+$-type source region 16, and the gate trench portion 20 described above. The mesa region 50 includes the drift region 12 and the base region 14, and therefore the mesa region 50 is also formed by the GaN-based semiconductor material.

In the present example, the bottom of the source region 16 enters into the base region 14. Therefore, at least part of the base region 14 is provided below the source region 16. In FIG. 1, the contour of the top portion 54 of the mesa region 50 (i.e. the top end of the base region 14) that is farther outside than the source region 16 with the gate trench portion 20 as the center is clear. The top portion 54 of the mesa region 50 (i.e. the top end of the base region 14) within the source region 16 is indicated by a dotted line.

The portion of the base region 14 positioned at the side portions of the gate trench portion 20 may form a channel when the gate is ON. In the present example, the gate being ON refers to a case in which a prescribed positive voltage for forming the channel is applied to the gate conducting portion 26 inside the gate trench portion 20. In contrast to this, the gate being OFF refers to a case in which a ground potential (i.e. 0 [V]) or a prescribed negative voltage is applied to the gate conducting portion 26. When the semiconductor device 100 is in use, the ground potential may be supplied to the source electrode 30 and a high voltage may be supplied from an external power supply voltage to the drain electrode 40.

The side portions 52 of the mesa region 50 may be borders between the mesa region 50 and the isolation trench portions 60. In the present example, the two side portions 52 and the top portion 54 of the mesa region 50 define a rectangular convex shape. In contrast to this, each isolation trench portion 60 in the present example has a rectangular concave shape. In the present example, the bottom portions 62 of the isolation trench portions 60 and the two side portions 52 of the mesa region 50 define a rectangular concave shape.

The contact layer 18 may be provided in contact with the bottom portions 62 of the isolation trench portion 60 and the side portions 52 and top portion 54 of the mesa region 50. The contact layer 18 of the present example is a p$^+$-type layer epitaxially formed in contact with the mesa region 50 and the isolation trench portions 60. The contact layer 18 has a higher p-type impurity concentration than the base region 14.

Generally, forming p-type GaN material through ion implantation is more difficult than forming p-type SiC through ion implantation. For example, the p-type impurity elements that are ion-implanted in the SiC semiconductor material are known to be activated as p-type acceptors by performing thermal treatment on this SiC semiconductor material at a high temperature greater than or equal to 1600° C. In contrast to this, in order to activate the p-type impurity element ion-implanted in the GaN semiconductor material as p-type acceptors, it is necessary to perform thermal treatment on this GaN semiconductor material at a high temperature greater than or equal to 1300° C. However, when normal thermal treatment is performed in a state where the ion-implantation region is exposed in the thermal treatment atmosphere, it is possible for the nitrogen atoms to be desorbed such that the crystallinity of the GaN semiconductor material breaks down, and it is difficult to realize the prescribed p-type carrier concentration because the nitrogen holes can function as donor-type defects. In thermal treatment at a temperature less than 1300° C., it is impossible to activate the p-type impurities ion-implanted in the GaN semiconductor material to function as p-type acceptors.

In this way, even when the p-type impurity element (e.g. magnesium (Mg)) is ion-implanted in the GaN material, it is generally difficult for this p-type impurity element to suitably function as a p-type acceptor in the GaN material. In contrast to this, in the present example, since the p$^+$-type contact layer 18 is epitaxially formed, it is possible to reliably form the contact layer 18 having a high p-type acceptor concentration on the bottom portions 62 of the isolation trench portions 60 and on the side portions 52 and top portion 54 of the mesa region 50.

Furthermore, the source region 16 of the present example is formed by counter-doping part of the contact layer 18 to be n-type through ion implantation. Therefore, impurities that are the same as in the contact layer 18 may be present inside the source region 16. In the present example, the n-type impurity concentration in the source region 16 and the p-type impurity concentration in the contact layer 18 provided in contact with the bottom portions 62 of the isolation trench portions 60 are the same. The source region 16 of the present example has a higher n-type impurity concentration than the drift region 12.

At least part of the source electrode 30 may be provided on the contact layer 18 provided on the top portion 54 of the mesa region 50. The source electrode 30 of the present example is provided on the source region 16 and the contact layer 18. The p$^+$-type contact layer 18 can provide ohmic contact between the GaN-based semiconductor material and the source electrode 30.

The p$^+$-type contact layer 18 and the n$^-$-type drift region 12 form a pn junction at the side portions 52 and the bottom portions 62. The contact layer 18 of the present example has a p-type impurity concentration that is sufficiently higher than the n-type impurity concentration of the drift region 12. For example, the p-type impurity concentration of the contact layer 18 is three to four orders of magnitude greater than the n-type impurity concentration of the drift region 12. The n-type impurity concentration of the drift region 12 is greater than or equal to 1E+16 [cm$^{-3}$] and less than or equal to 2E+16 [cm$^{-3}$], for example. In contrast to this, the p-type impurity concentration of the contact layer 18 is greater than or equal to 1E+19 [cm$^{-3}$] and less than or equal to 1E+20 [cm$^{-3}$], for example. Here, E indicates 10 to a certain power, such that 1E+16 means $10^{16}$.

At the pn junction, the expansion of the depletion layer in the n-type layer becomes smaller as the n-type impurity concentration becomes higher. Similarly, the expansion of the depletion layer in the p-type layer becomes smaller as the p-type impurity concentration becomes higher. In the present example, the p-type impurity concentration of the p$^+$-type contact layer 18 is sufficiently higher than the n-type impurity concentration of the n$^-$-type drift region 12. Therefore, during the gate OFF period in which the depletion layer expands at the pn junction of the drift region 12 and the contact layer 18, it is possible to prevent a punch-through, i.e. the depletion layer reaching the source electrode 30 across the entirety of the side portions 52 of the mesa region 50 and the bottom portions 62 of the isolation trench portions 60.

The gate trench portion 20 may include a trench 22, a gate insulating film 24, and a gate conducting portion 26. The trench 22 of the present example is a region formed by etching the mesa region 50 and the contact layer 18, and may define the contour of the gate trench portion 20. In the etching process, etching may be performed on only a predetermined region using known photolithography. The gate insulating film 24 is provided on a surface within the trench 22. The gate conducting portion 26 is provided inside the trench 22 in contact with the gate insulating film 24.

The gate trench portion 20 may be provided in in the substantial center of the mesa region 50 in the X-axis direction. The source region 16 and the contact layer 18 may each be positioned at both ends of the gate trench portion 20 in the X-axis direction. The gate trench portion 20 may penetrate through the base region 14 until reaching a position lower than the junction portion of the base region 14 and drift region 12. It should be noted that, in the present example, the bottom portion of the gate trench portion 20 is positioned higher than the bottom portions 62 of the isolation trench portions 60.

As shown in FIG. 1, the side portions of the gate trench portion 20 may be parallel to the Z-axis direction, and the bottom portion of the gate trench portion 20 may be parallel to the X-axis direction. In the present example, corner portions 23 are formed defined by the positions where the side portions and the bottom portion of the gate trench portion 20 intersect. In other words, the corner portions 23 may be positioned at the bottom ends of the side portions of the gate trench portion 20 in contact with the base region 14. The corner portions 23 may have right angles or substantially right angles. At the corner portions 23, equipotential lines tend to become dense when the gate is OFF. In other words, the electrical field strength tends to become high at the corner portions 23. When the electrical field strength exceeds a prescribed upper limit value, the gate insulating film 24 breaks down. Once the gate insulating film 24 has broken down, the switching function of the semiconductor device 100 is impaired. Therefore, the electrical field strength is preferably reduced at the corner portions 23 of the gate trench portion 20.

In the present example, the bottom portions 62 of the isolation trench portions 60 are provided lower than the bottom portion of the gate trench portion 20. In this way, the corner portions defined by the positions where the side portions 52 of the mesa region 50 intersect with the bottom portions 62 of the isolation trench portions 60 are positioned lower than the corner portions 23 of the gate trench portion 20.

In this way, the equipotential lines occurring when the gate is OFF tend to become denser at the corner portions 13 of the isolation trench portions 60 than at the corner portions 23 of the gate trench portion 20. In other words, the electrical field strength of the corner portions 13 of the isolation trench portions 60 tends to be higher than the electrical field strength of the corner portions 23 of the gate trench portion 20. In FIG. 1, an example of the equipotential lines occurring when the gate is OFF is indicated by dotted lines in the drift region 12.

In the present example, breakdown occurs at corner portions 13 of isolation trench portions 60 that are pn junction portions, before insulation breakdown occurs at the corner portions 23 of the gate trench portion 20. Therefore, it is possible to protect the corner portions 23 of the gate trench portion 20 with the corner portions 13 of the isolation trench portions 60. There is a possibility that the switching function of the semiconductor device 100 will not exhibit any impairment even when a breakdown occurs once at a pn junction portion, but the semiconductor device 100 stops functioning when an insulation breakdown occurs in the gate insulating film 24. In the present example, it is possible to improve the reliability of the semiconductor device 100 by preventing the breakdown of the gate insulating film 24.

The corner portions 23 in the present example have right angles, but in another example, the side portions and bottom portion of the gate trench portion 20 may be connected by curved corners (or curved surfaces in a case that considers expansion in the Y-axis direction). In this case as well, the curved corner (or curved surface) portions may be treated as the corner portions 23. In a case where the corner portions 23 are curved as well, it is possible to protect the corner portions 23 of the gate trench portions 20 with the corner portions 13 of the isolation trench portions 60 in the same manner.

The source electrode 30 may be provided at least on the contact layer 18, in order to achieve ohmic contact with the contact layer 18. The source electrode 30 of the present example is provided in contact with the contact layer 18 and part of the source region 16. In other words, the source electrode 30 of the present example covers part of the top portion 54 of the mesa region 50, the side portions 52 of the mesa region 50, and the bottom portions 62 of the isolation trench portions 60. The source electrode 30 of the present example is provided neither on other portions of the source region 16 nor on the gate trench portion 20. If the top portion of the gate trench portion 20 is covered by an interlayer insulating film, the source electrode 30 may be provided on the gate trench portion 20 with this interlayer insulating layer interposed therebetween. The drain electrode 40 is provided below the substrate 10, in contact with the bottom surface of the substrate 10.

Figure 2:
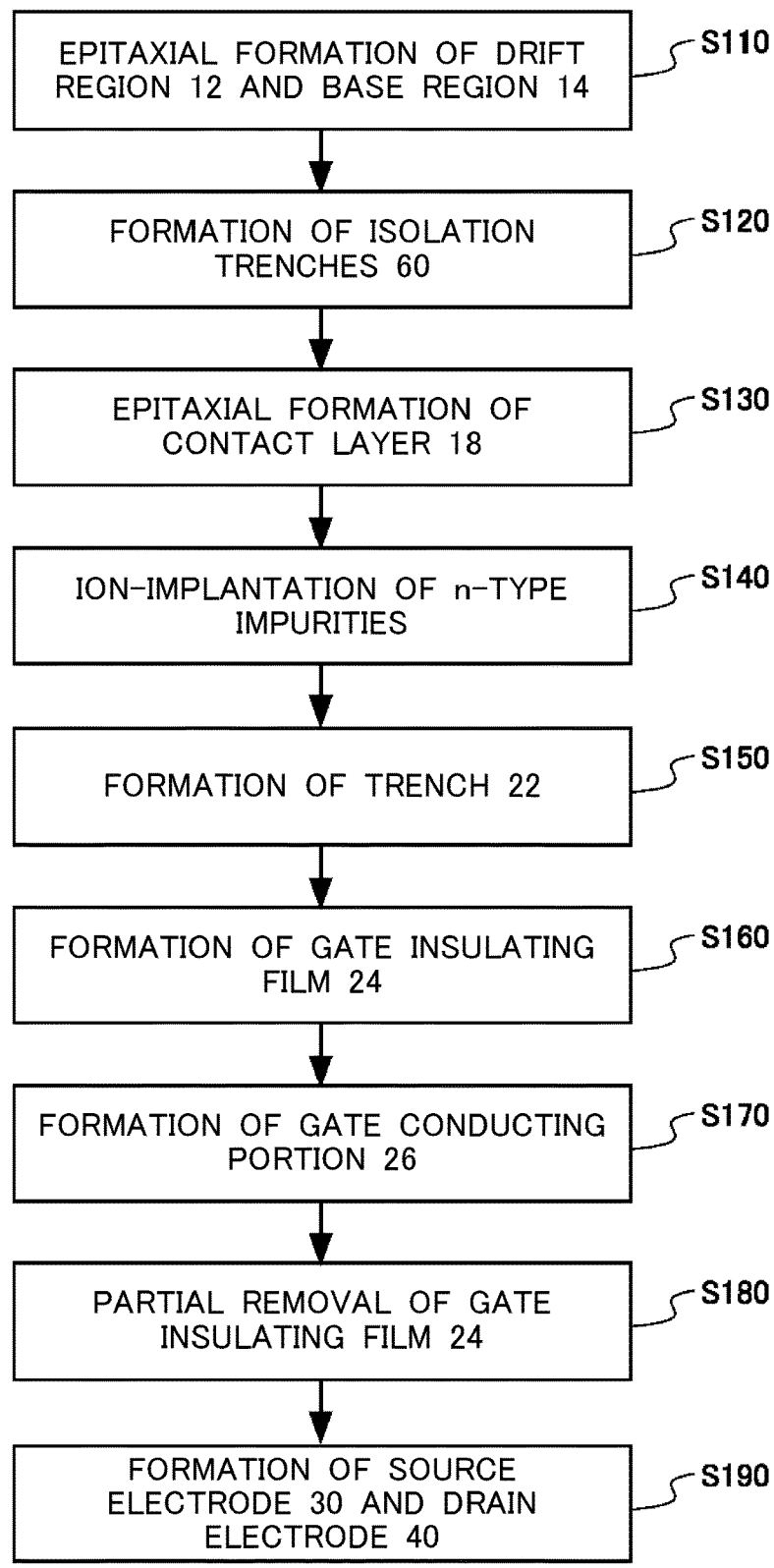
FIG. 2 is a flow chart showing a manufacturing method of the semiconductor device 100 according to the first embodiment.

FIG. 2 is a flow chart showing a manufacturing method of the semiconductor device 100 according to the first embodiment. In the present example, steps are performed in numerical order from step S110 to step S190 (i.e. in order from lower numbers). Steps S110 to S190 correspond respectively to (a) to (i) in FIG. 3 described further below. Each step merely shows a main step in the semiconductor device 100 manufacturing method. Each step may include cleaning of the manufacturing apparatus, thermal treatment of the substrate being processed, or the like as needed.

Figure 3:
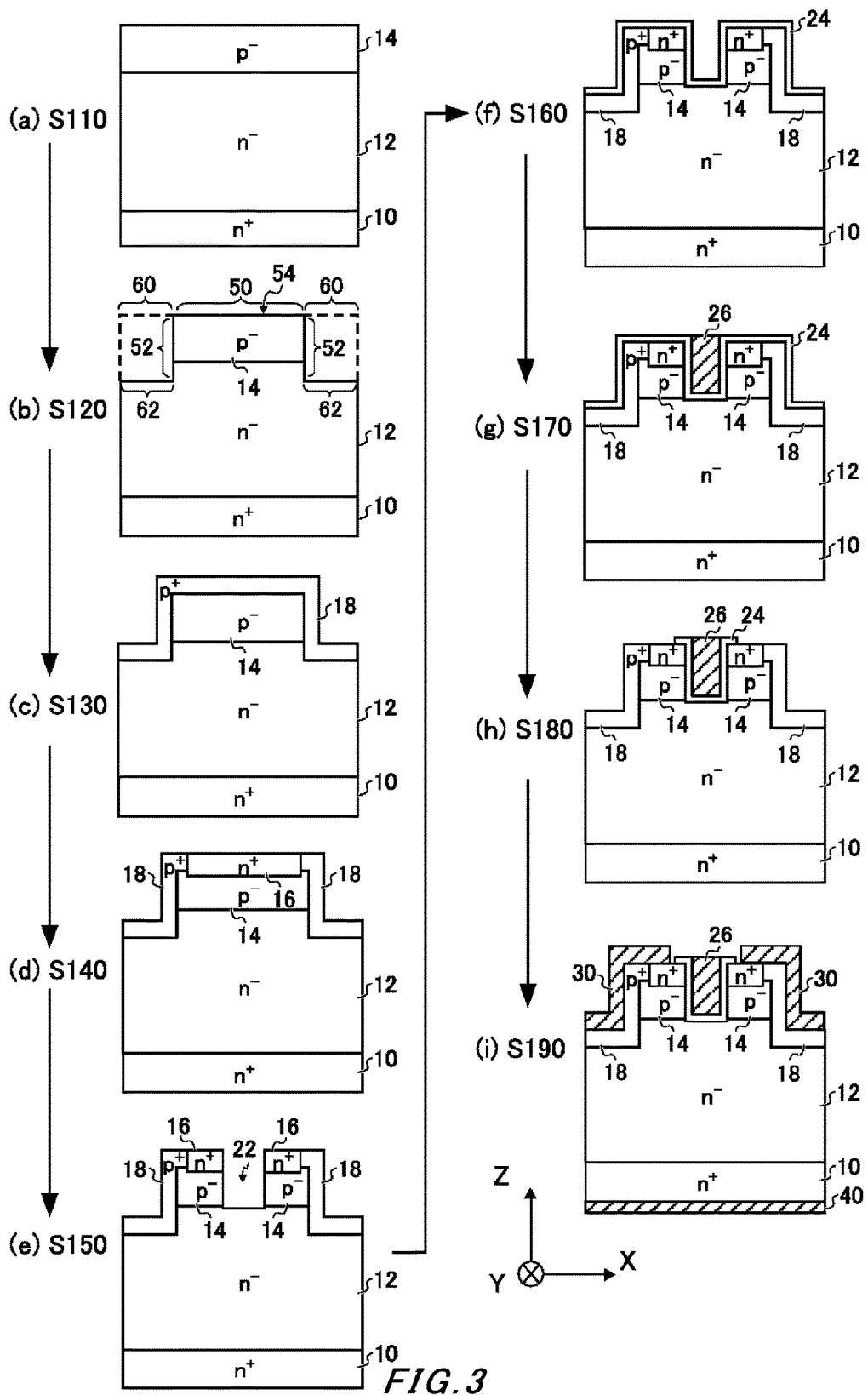
FIG. 3 is a cross-sectional view in which (a) to (i) show the steps of the manufacturing method of the semiconductor device 100 according to the first embodiment.

FIG. 3 is a cross-sectional view in which (a) to (i) show the steps of the manufacturing method of the semiconductor device 100 according to the first embodiment. In FIG. 3, (a) is a step (S110) of epitaxially forming the drift region 12 on the substrate 10 and then epitaxially forming the base region 14 on the drift region 12. The substrate 10 of the present example is an $n^+$-type single-crystal substrate with low dislocation. The drift region 12 may have a thickness that is greater than or equal to 5 [μm] and less than or equal to 20 [μm]. The thickness in the Z-axis direction refers to the length of a substrate, region, layer, or the like in the Z-axis direction. Furthermore, the drift region 12 may have an n-type impurity concentration that is greater than or equal to 1E+16 [$cm^{-3}$] and less than or equal to 2E+16 [$cm^{-3}$].

The base region 14 may have a thickness that is greater than or equal to 1 [μm] and less than or equal to 2 [μm]. The base region 14 may have a p-type impurity concentration that is greater than or equal to 1E+17 [$cm^{-3}$] and less than or equal to 5E+18 [$cm^{-3}$]. The drift region 12 and the base region 14 may each be epitaxially formed using metal organic chemical vapor deposition (MOCVD) or halide vapor phase epitaxy (HYPE).

If the $n^-$-type of drift region 12 is epitaxially formed using MOCVD, raw material gas including trimethyl gallium ($Ga(CH_3)_3$), ammonia ($NH_3$), and monosilane ($SiH_4$) and a pressurized gas including nitrogen ($N_2$) and hydrogen ($H_2$) may be made to flow on the substrate 10 that has been heated to a prescribed temperature. The types of raw material gas and pressurized gas are not limited to the examples described above. The n-type impurities may be one or more types of elements among Si (silicon), Ge (germanium), and O (oxygen). In the present example, the Si of the $SiH_4$ functions as the n-type impurities in the drift region 12. It should be noted that the drift region 12 may include other n-type impurities.

If the $p^-$-type base region 14 is epitaxially formed using MOCVD, raw material gas including trimethyl gallium, ammonia, and biscyclopentadienyl magnesium (Cp$_2$Mg) and a pressurized gas including nitrogen (N$_2$) and hydrogen (H$_2$) may be made to flow on the drift region 12 that has been heated to a prescribed temperature. The types of raw material gas and pressurized gas are not limited to the examples described above. The p-type impurities may be one or more types of elements among Mg, Ca (calcium), Hg (mercury), Be (beryllium), and Zn (zinc). In the present example, the Mg of the Cp$_2$Mg functions as the p-type impurities. It should be noted that the base region 14 may include other p-type impurities.

In FIG. 3, (b) is a step (S120) of forming the isolation trench portions 60. After a mask material corresponding to the mesa region 50 is provided, the region where this mask material is not provided may be removed by etching. In this way, by partially removing the drift region 12 and the base region 14, the mesa region 50 may be formed between at least two isolation trench portions 60.

In FIG. 3, (c) is a step (S130) of epitaxially forming the contact layer 18. The contact layer 18 may have a thickness that is greater than or equal to 0.1 [μm] and less than or equal to 0.5 [μm]. The contact layer 18 may have a p-type impurity concentration that is greater than or equal to 1E+19 [cm$^{-3}$] and less than or equal to 1E+20 [cm$^{-3}$]. The contact layer 18 may also be epitaxially formed using metal organic chemical vapor deposition (MOCVD) or halide vapor phase epitaxy (HYPE). The contact layer 18 may have the same predetermined thickness at the top portion 54 of the mesa region 50, the side portions 52 of the mesa region 50, and the bottom portions 62 of the isolation trench portion 60. The thickness at the side portions 52 of the mesa region 50 refers to the length of the contact layer 18 in the X-axis direction.

Even if the thickness of the contact layer 18 is not the same at the side portions 52, the top portion 54, and the bottom portions 62, the integrated concentration of p-type impurities obtained by integrating the p-type impurity concentration in the thickness direction may be constant in the contact layer 18. In the present example, the integrated concentration of p-type impurities is the same at the top portion 54 and side portions 52 of the mesa region 50 and the bottom portions 62 of the isolation trench portions 60.

Although not shown in FIG. 3, the semiconductor device 100 manufacturing method may further include a step of thermally treating the substrate being processed that includes the drift region 12, the base region 14, and the contact layer 18, after the step (S130) of epitaxially forming the contact layer 18 and before the step (S140) of ion-implanting the n-type impurities. In this way, it is possible to activate the impurities in the regions and layers that are epitaxially formed. This thermal treatment may be omitted and the impurities in the regions and layers that are epitaxially formed may be activated by thermal treatment after the step (S140) of ion-implanting the n-type impurities.

In FIG. 3, (d) is a step (S140) of ion-implanting the n-type impurities. In this step, n-type impurities are ion-implanted in a predetermined region of the contact layer 18 provided on the top portion 54 of the mesa region 50. After the mask material having an opening on a region corresponding to part of the top portion 54 of the mesa region 50 is provided, the n-type impurities may be ion-implanted via this opening. In this way, it is possible to form the n-type impurity implantation region directly below the opening. In contrast to this, n-type impurities are not implanted in the region covered by the mask material. The n-type impurity elements that are ion-implanted may be Si or O. By forming the n-type impurity region using ion-implantation, it is possible to form the n-type impurity region locally, in comparison to a case where the n-type impurity region is epitaxially grown. In other words, it is possible to form the n-type impurity region more finely by using ion implantation.

The implantation depth of the n-type impurities can be controlled according to the acceleration energy of the n-type impurity elements. The n-type impurities may be ion-implanted to a depth that is greater than or equal to 0.1 [μm] and less than or equal to 0.5 [μm] from the topmost surface of the contact layer 18, with a dose amount that is greater than or equal to 1E+15 [cm$^{-2}$] and less than or equal to 1E+16 [cm$^{-2}$]. The substrate being processed that includes the contact layer 18 that has undergone the ion implantation may be thermally treated by a thermal treatment apparatus at a temperature that is greater than or equal to 1000° C. and less than or equal to 1200° C. In this way, it is possible to activate the n-type impurities that are ion-implanted and to recover a certain amount of the crystallinity that was damaged by the ion implantation. In the present example, the substrate being processed is thermally treated at a temperature that is less than or equal to 1100° C. (first thermal treatment). By performing thermal treatment at a temperature that is less than or equal to 1100° C., it is possible to prevent the n-type impurities from being diffused into the base region 14 while recovering a certain amount of the crystallinity.

In terms of functionality, the source region 16 is strictly completed through the activation of the n-type impurity element in a second thermal treatment described further below, but the contour of the source region 16 may be roughly formed in S140. Therefore, (d) of FIG. 3 shows the n-type impurity implantation region as the source region 16. The source region 16 may have an n-type impurity concentration that is greater than or equal to 1E+19 [cm$^{-3}$] and less than or equal to 1E+21 [cm$^{-3}$]. After the ion implantation or the thermal treatment, part of the top portion of the base region 14 may be present below the source region 16. Since the n-type impurities of the present example are ion-implanted, the impurity concentration distribution may be a Gaussian distribution centered on a predetermined implantation depth.

In FIG. 3, (e) is a step (S150) of forming the trench 22. After providing a mask material having an opening in the region corresponding to the trench 22 on the top portion 54, the GaN-based semiconductor material of the mesa region 50 may be removed using etching. In this way, the trench 22 penetrating through the source region 16 and the base region 14 is formed. In the present example where thermal treatment at a temperature that is less than or equal to 1100° C. is performed on the substrate being processed in step S140, thermal treatment at a temperature greater than 1100° C. and less than or equal to 1200° C. is performed on the substrate being processed in step S150 (second thermal treatment). By performing thermal treatment with a temperature greater than 1100° C., it is possible to realize reliable recovery of the crystallinity and activation of the n-type impurities, which are insufficient when performing thermal treatment at a temperature that is less than or equal to 1100° C.

In FIG. 3, (f) is a step (S160) of forming the gate insulating film 24. In this step, in order to provide the gate insulating film 24 in the trench 22, the gate insulating film 24 may be formed over all of the mesa region 50 and the isolation trench portions 60. The gate insulating film 24 may be an SiO$_2$ film or may be an Al$_2$O$_3$ film. The gate insulating film 24 may be formed by chemical vapor deposition (CVD). The gate insulating film 24 may have a thickness that is greater than or equal to 50 [nm] and less than or equal to 100 [nm]. If thermal treatment at a temperature greater than 1100° C. was not performed on the substrate being processed in step S140 or step S150, thermal treatment at a temperature greater than 1100° C. and less than or equal to 1200° C. (corresponding to the temperature of the second thermal treatment) may be performed on the substrate being processed in step S150.

In FIG. 3, (g) is a step (S170) for forming the gate conducting portion 26. In this step, polysilicon doped with impurities is formed over the entire mesa region 50 and isolation trench portions 60, in order to provide the gate conducting portion 26 inside the trench 22 in contact with the gate insulating film 24. The gate conducting portion 26 may be formed using chemical vapor deposition (CVD). As a result of etching after the CVD, the gate conducting portion 26 may be made to remain only within the trench 22.

In FIG. 3, (h) is a step (S180) of partially removing the gate insulating film 24. In this step, the contact region between the contact layer 18 and the source electrode 30 is formed by removing the gate insulating film 24 in contact with the contact layer 18. In other words, in this step, an opening for contact is provided in the gate insulating film 24. As long as the gate insulating film 24 on the contact layer 18 is reliably removed, the gate insulating film 24 may remain on the source region 16. Through the steps from S150 to S180, the gate trench portion 20 can be formed.

In FIG. 3, (i) is a step (S190) of forming the source electrode 30 and the drain electrode 40. In this step, the source electrode 30 may be formed by sequentially forming Pd (palladium), Ti (titanium), and Al on the mesa region 50 and the isolation trench portions 60 using sputtering or the like. In other words, the source electrode 30 may be an electrode obtained by layering Pd, Ti, and Al in order from the side closer to the contact layer 18. Furthermore, the drain electrode 40 may be formed by sequentially layering Ti and Al on the back surface of the substrate 10 using sputtering or the like in the same manner. In other words, the drain electrode 40 may be an electrode obtained by layering Ti and Al in order from the side closer to the substrate 10.

Figure 4:
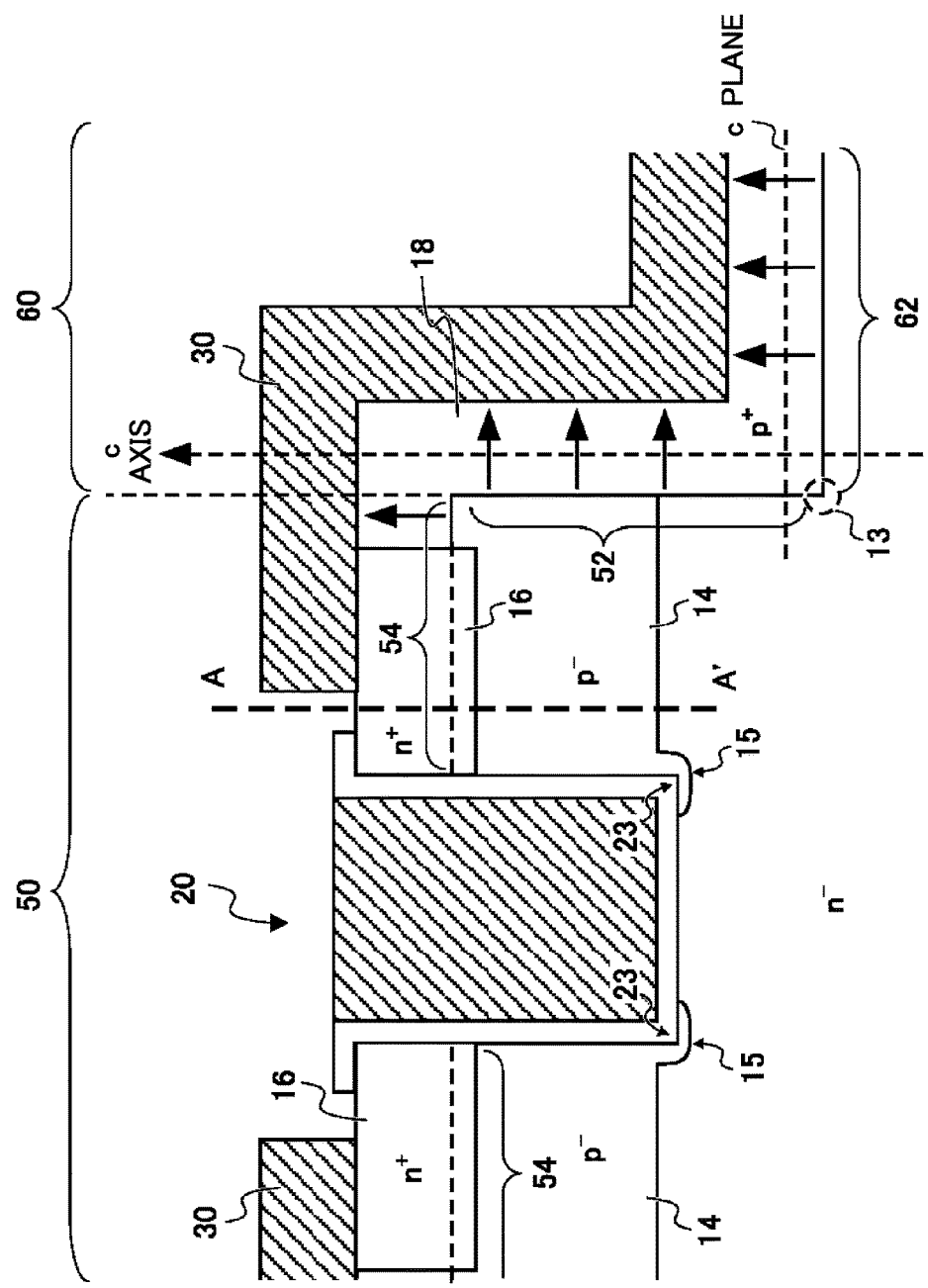
FIG. 4 is an enlarged view of the area near the mesa region 50 in FIG. 1.

FIG. 4 is an enlarged view of the area near the mesa region 50 in FIG. 1. The base region 14 according to the first embodiment may include a p⁻-type expansion region 15. The expansion region 15 of the present example is a part of the base region 14. The expansion region 15 may be formed as a result of the thermal treatment at a temperature exceeding 1100° C. (the second thermal treatment), and not the thermal treatment at a temperature that is less than or equal to 1100° C. after the ion implantation (the first thermal treatment). Although not limited to being the result of only a specified cause, the region near the trench 22 in the base region 14 may be deformed to protrude downward as a result of the defects introduced into the contact layer 18 and the base region 14 when the ion implantation is performed in step S140 described above propagating downward through the thermal treatment at a temperature greater than 1100° C. (the second thermal treatment) in any one of steps S140, S150, and S160. In this way, the expansion region 15 may be substantially L-shaped and cover the corner portions 23 of the gate trench portion 20.

In the present example, the thermal treatment at a temperature greater than 1100° C. (the second thermal treatment) is performed after the formation of the trench 22. Therefore, the expansion region 15 of the present example is not formed on the bottom portion of the trench 22, except near the corner portions 23. If the expansion region 15 were to be formed on the entire bottom portion of the trench 22, there is a fear that the semiconductor device 100 would be unable to function as a MOSFET. The expansion region 15 of the present example keeps the semiconductor device 100 functioning as a MOSFET, by covering only the corner portions 23 of the gate trench portion 20.

Having the expansion region 15 cover the corner portions 23 of the gate trench portion 20 means that at least part of the base region 14 is positioned on the bottom portion of the trench 22. The expansion region 15 may extend in the X-axis direction by an amount equal to the width of the gate insulating film 24 at the side portions of the trench 22, at a position deeper than the bottom portion of the trench 22. In the present example, the expansion region 15 can cover the corner portions 23 of the gate trench portion 20, and therefore the electrical field strength at the corner portions 23 can be reduced in comparison to a case where the expansion region 15 does not cover the corner portions 23. In this way, in conjunction with providing the contact layer 18, it is possible to synergistically improve the effect of protecting the corner portions 23.

As described above in step S130, the contact layer 18 is epitaxially formed in contact with the mesa region 50 and the isolation trench portions 60. The epitaxial formation of the contact layer 18 is indicated by the arrows drawn in the contact layer 18. The contact layer 18 grows in the directions indicated by the arrows. In the present example, the main plane of the substrate 10 is the c plane. Therefore, the main plane of the drift region 12 is also the c plane. Furthermore, the main plane of the bottom portion 62 of the isolation trench portion 60 is also a surface parallel to the c plane. In this way, in the present example, the top portion 54 of the mesa region 50 and the bottom portions 62 of the isolation trench portions 60 are parallel to the c plane, and the side portions 52 of the mesa region 50 are parallel to a c axis that is perpendicular to this c plane. In another example, the main plane of the substrate 10 and the drift region 12 have an off-angle of several degrees, and in accordance with this, the side portions 52 of the mesa region 50 do not need to be completely parallel to the c axis.

In the present example, the contact layer 18 is epitaxially formed, and therefore the p-type impurity concentration of the contact layer 18 provided on the side portions 52 of the mesa region 50 and the p-type impurity concentration of the contact layer 18 provided in contact with the bottom portions 62 of the isolation trench portions 60 can be made the same. By growing the contact layer 18 in contact with the side portions 52 of the mesa region 50 in a specified planar direction perpendicular to the c axis, it is possible to make the p-type impurity concentration of the contact layer 18 provided in contact with the side portions 52 and in contact with the bottom portions 62 the same.

In this way, the depletion layer expands more easily in the direction parallel to the X-axis direction from the side portions 52 of the mesa region 50 toward the center of the mesa region 50, compared to a comparative example in which the p-type impurity concentration of the side portions 52 is lower than the p-type impurity concentration of the bottom portions 62. Since the depletion layer can function as an insulator, if the depletion layer reaches the corner portions 23 of the gate trench portion 20, the depletion layer assists with the protecting the corner portions 23 from insulation breakdown. Therefore, in the present example, it is possible to more reliably prevent the occurrence of insulation breakdown in the corner portions 23 of the gate trench portion 20, compared to this comparative example.

As a modification of the present example, the p-type impurity concentration of the contact layer 18 provided on the side portions 52 of the mesa region 50 may be higher than the p-type impurity concentration of the contact layer 18 provided in contact with the bottom portions 62 of the isolation trench portion 60. By growing the contact layer 18 in contact with the side portions 52 of the mesa region 50 in the specified planar direction perpendicular to the c axis, the p-type impurity concentration of the contact layer 18 of the side portions 52 can be made higher than the p-type impurity concentration of the contact layer 18 of the bottom portions 62. In this way, the depletion layer expands even more easily in the direction parallel to the X-axis direction from the side portions 52 of the mesa region 50 toward the center, and therefore it is possible to more reliably protect the corner portions 23 of the gate trench portion 20.

Figure 5:
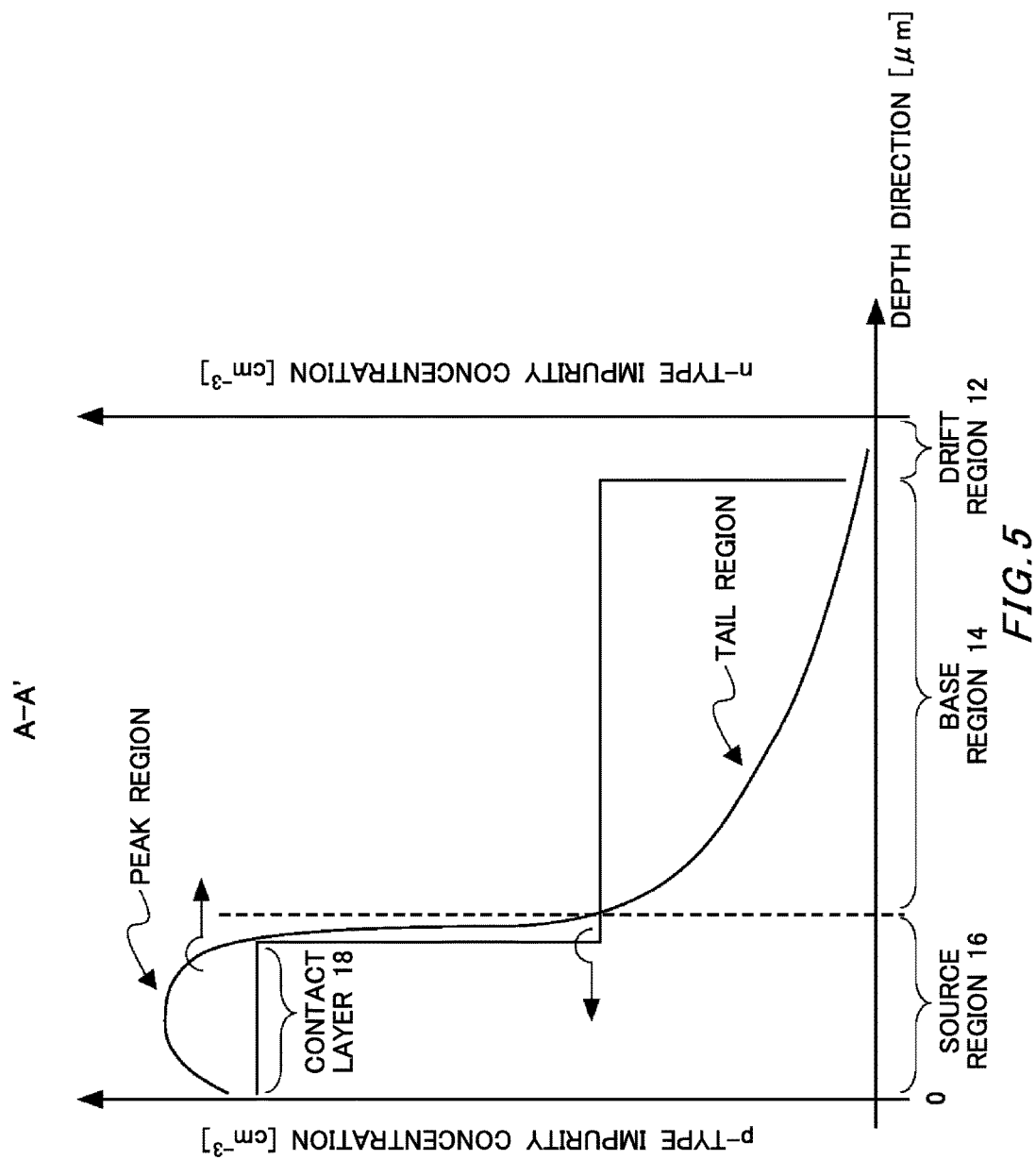
FIG. 5 is a diagram showing an outline of the impurity concentration in the A-A' cross section of FIG. 4.

FIG. 5 is a diagram showing an outline of the impurity concentration in the A-A' cross section of FIG. 4. The A-A' cross section is a cross section passing through the source region 16, the base region 14, and the drift region 12. The A-A' cross section does not pass through the expansion region 15. In FIG. 5, the horizontal axis is the depth direction, the left side of the vertical axis is the p-type impurity concentration, and the right side of the vertical axis is the n-type impurity concentration. FIG. 5 shows the outline of the impurity concentration distribution. The depth direction is a direction parallel to the Z-axis direction, e.g. a direction from the top portion of the gate trench portion 20 toward the bottom portion or a direction from the base region 14 toward the drift region 12.

Since the base region 14 and the contact layer 18 are respectively epitaxially formed in steps S110 and S130, the p-type impurity concentrations of the base region 14 and the contact layer 18 may each be constant in the depth direction. The p-type impurity concentration of the base region 14 may be constant within a range of greater than or equal to 1E+17 [cm$^{-3}$] and less than or equal to 5E+18 [cm$^{-3}$]. The p-type impurity concentration of the contact layer 18 may be constant within a range of greater than or equal to 1E+19 [cm$^{-3}$] and less than or equal to 1E+20 [cm$^{-3}$].

In contrast to this, the base region 14 may have a tail region in which the n-type impurity concentration gradually decreases in the depth direction. The tail region may be formed by diffusing the n-type impurities used for forming the source region 16 in step S140 downward (to the base region 14 and the drift region 12). In other words, the n-type impurities of the tail region and the n-type impurities of the source region 16 may be n-type impurities of the same element. In step S140, ion implantation may be performed one or more times with a prescribed dose amount and a prescribed ion implantation acceleration energy. In this way, the n-type impurity concentration distribution of the source region 16 may have a peak region shaped like a mountain, and the apex portion may be a flat peak region. It should be noted that the tail region is formed whether the ion implantation is performed one time or a plurality of times.

The n-type impurity concentration of the tail region is sufficiently lower than the p-type impurity concentration of the base region 14, and therefore can be thought of as not affecting the channel length in the side portions of the gate trench portion 20. In the present example, it is possible to prevent shortening of the channel length in the base region 14 while forming the n$^+$-type source region 16 locally.

Figure 6:
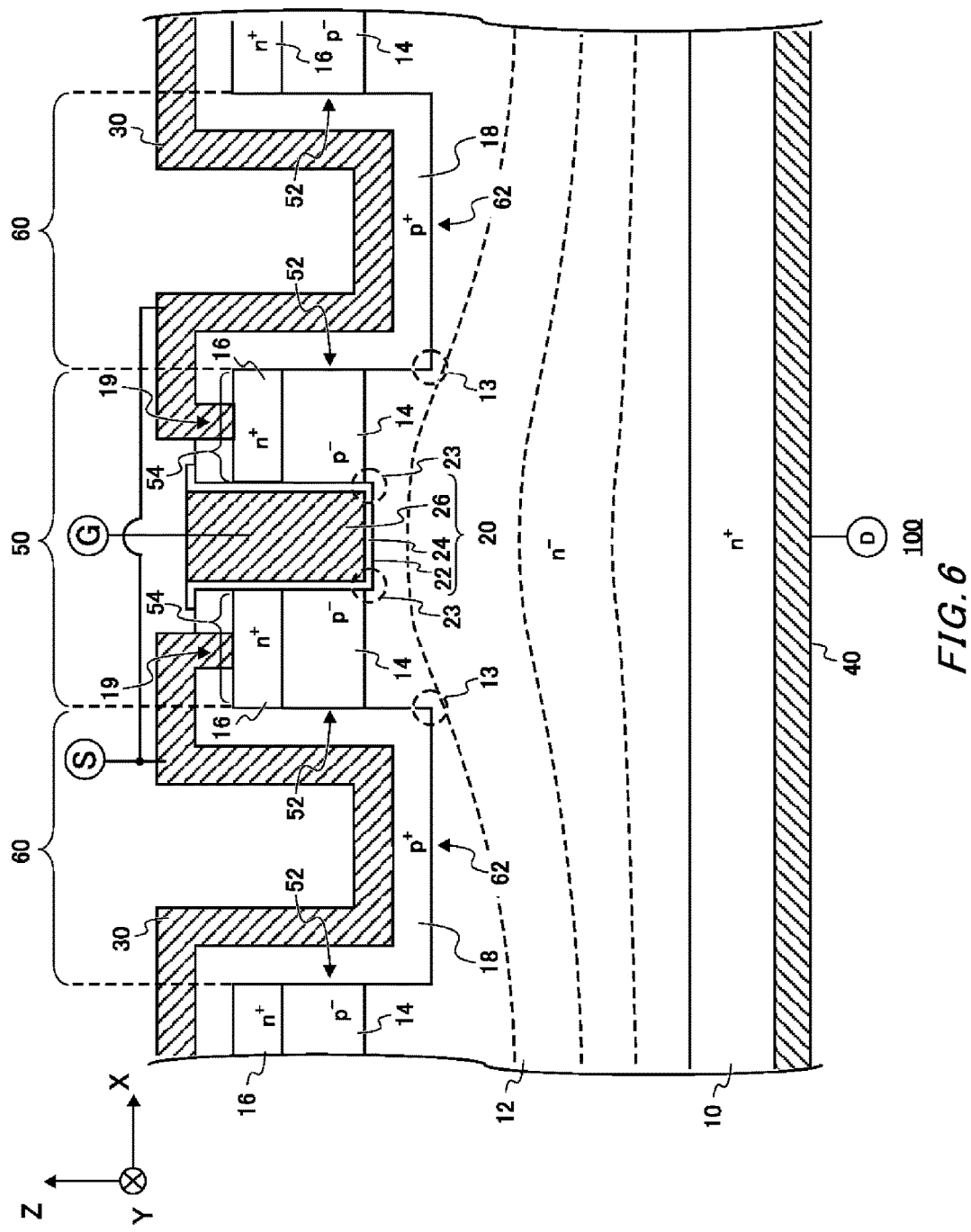
FIG. 6 is a cross-sectional view of the semiconductor device 100 according to a second embodiment.

FIG. 6 is a cross-sectional view of the semiconductor device 100 according to a second embodiment. The source region 16 of the present example is epitaxially formed between the base region 14 and the contact layer 18, instead of being formed using ion implantation. In other words, the source electrode 30 of the present example contacts the source region 16 through the opening 19 of the contact layer 18 provided higher than the source region 16. Furthermore, the mesa region 50 includes the source region 16 on the entirety of the base region 14, except for the gate trench portion 20. The present example differs from the first embodiment mainly with regard to these points. Features of the present example that are shared with the first embodiment can realize the same beneficial effects as in the first embodiment.

The epitaxially grown layers, films, and regions sometimes include oxide films on the topmost surfaces thereof immediately after being formed. For example, although not limited to only the reason below, there are cases where a natural oxide film is formed due to residual oxygen in the deposition environment for the epitaxial formation. In particular, an n-type epitaxial layer grows a natural oxide film more easily than a p-type epitaxial layer. This oxide film can have a resistance closer to that of an insulator than a semiconductor.

In the present example, the opening 19 of the contact layer 18 penetrates through the contact layer 18 and reaches the source region 16. Therefore, when forming the opening 19 by etching the contact layer 18, it is possible to also remove the natural oxide film on the source region 16 directly below the opening 19. In this way, it is possible to eliminate the unnecessary contact resistance between the source region 16 and the source electrode 30.

Figure 7:
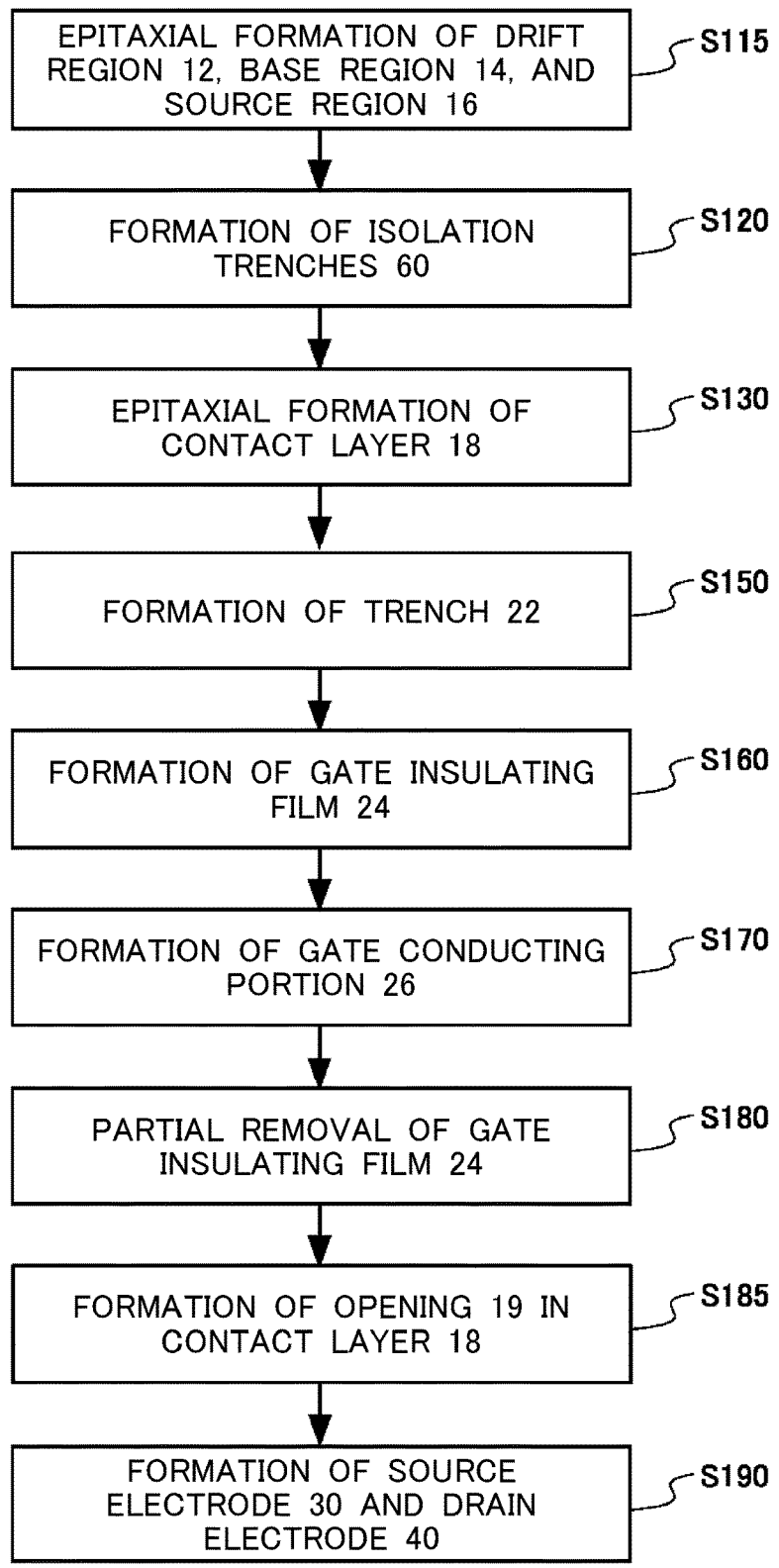
FIG. 7 is a flow chart showing a manufacturing method of the semiconductor device 100 according to the second embodiment.
Figure 8:
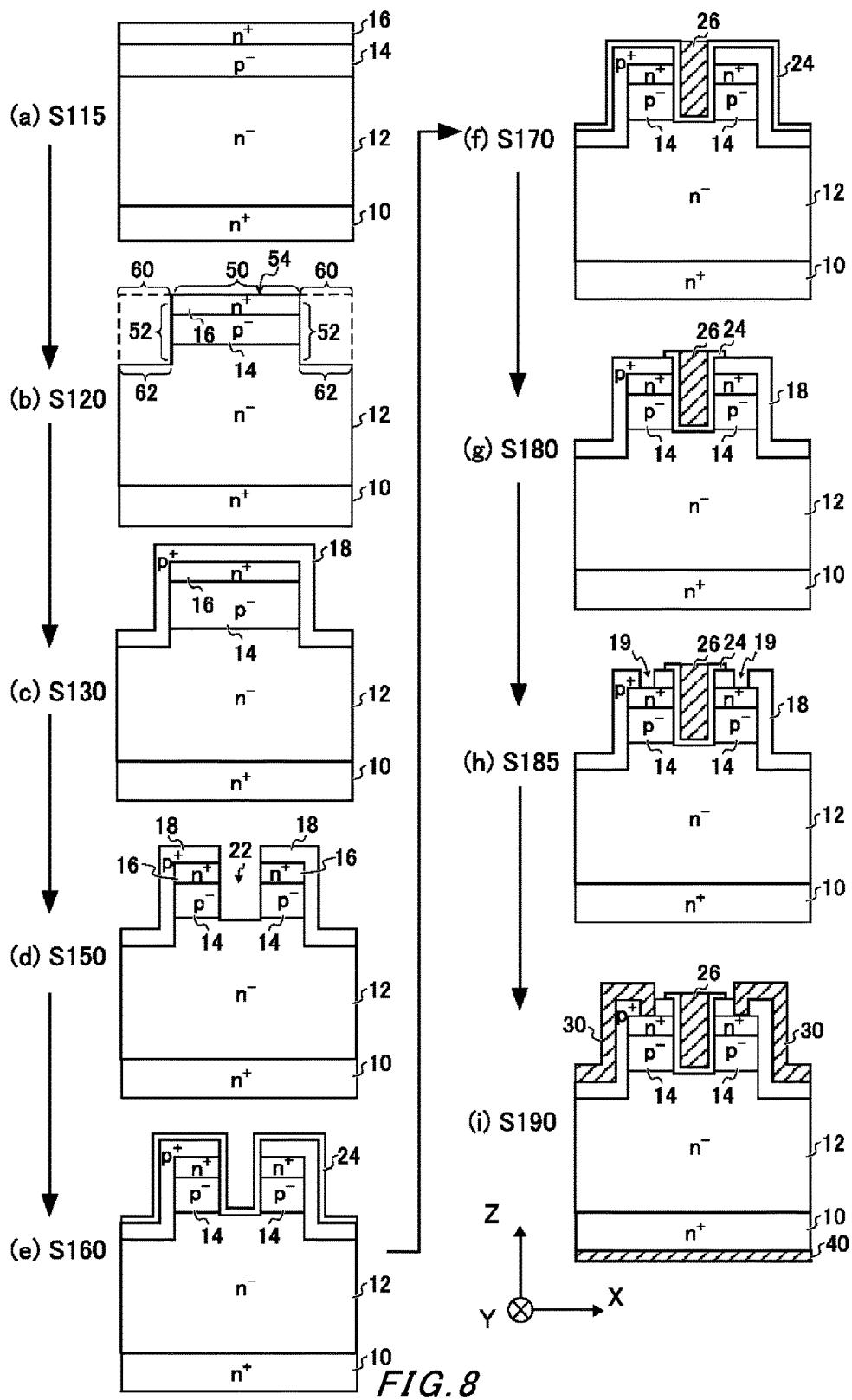
FIG. 8 is a cross-sectional view in which (a) to (i) show the steps of the manufacturing method of the semiconductor device 100 according to the second embodiment.

FIG. 7 is a flow chart showing a manufacturing method of the semiconductor device 100 according to the second embodiment. In the present example, steps are performed in numerical order from step S115 to step S190 (i.e. in order from lower numbers). Steps S115 to S190 correspond respectively to (a) to (i) in FIG. 8 described further below. In the present example, step S115 is included instead of step S110 of the first embodiment. Furthermore, in the present example, step S140 of the first embodiment is not included. Yet further, the present example includes step S185, which is not in the first embodiment. In the description of FIG. 8, the description is mainly about these differences with respect to the first embodiment.

FIG. 8 is a cross-sectional view in which (a) to (i) show the steps of the manufacturing method of the semiconductor device 100 according to the second embodiment. In FIG. 8, (a) is a step (S115) of epitaxially forming the drift region 12 on the substrate 10, then epitaxially forming the base region 14 on the drift region 12, and then epitaxially forming the n-type source region 16 on the base region 14. The source region 16 may have a thickness that is greater than or equal to 0.1 [µm] and less than or equal to 0.5 [µm]. The source region 16 may have an n-type impurity concentration that is greater than or equal to 1E+20 [cm$^{-3}$] and less than or equal to 1E+21 [cm$^{-3}$].

In FIG. 8, (b) is a step (S120) of forming the isolation trench portions 60. In step S120 of the present example, the source region 16 is also partially removed, in addition to the drift region 12 and the base region 14. In this way, the mesa region 50 and the isolation trench portions 60 are formed.

In FIG. 8, (c) is a step (S130) of epitaxially forming the contact layer 18. Step S130 is the same as in the first embodiment, and therefore a description of this step is omitted. In the first embodiment, the source region 16 is formed by implanting the n-type impurities in the contact layer 18, but in the present example, the source region 16 has already been formed. Therefore, the present example does not include step S140 of the first embodiment.

In FIG. 8, (d) is a step (S150) of forming the trench 22. In step S150 of the present example, the trench 22 is formed to penetrate through the source region 16 as well, in addition to the drift region 12 and the base region 14. The bottom portion of the trench 22 may be positioned lower than the junction portion between the drift region 12 and the base region 14. Step S150 of the present example differs from this step in the first embodiment with respect to the above point, but is otherwise the same.

In FIG. 8, (e) is a step (S160) of forming the gate insulating film 24. In FIG. 8, (f) is a step (S170) of forming the gate conducting portion 26. In FIG. 8, (g) is a step (S180) of partially removing the gate insulating film 24. Steps S160 to S180 are the same as in the first embodiment, and therefore detailed descriptions of these steps are omitted.

In FIG. 8, (h) is a step (S185) of forming the opening 19 in the contact layer 18. After providing the mask material having an opening in the region corresponding to the opening 19, the contact layer 18 directly below the opening of the mask material may be removed by etching. As described above, in step S185, the natural oxide film positioned on the topmost surface of the source region 16 and directly below the opening 19 may be removed.

In FIG. 8, (i) is a step (S190) of forming the source electrode 30 and the drain electrode 40. Step S190 is the same as in the first embodiment, and therefore a detailed description of this step is omitted.

Figure 9:
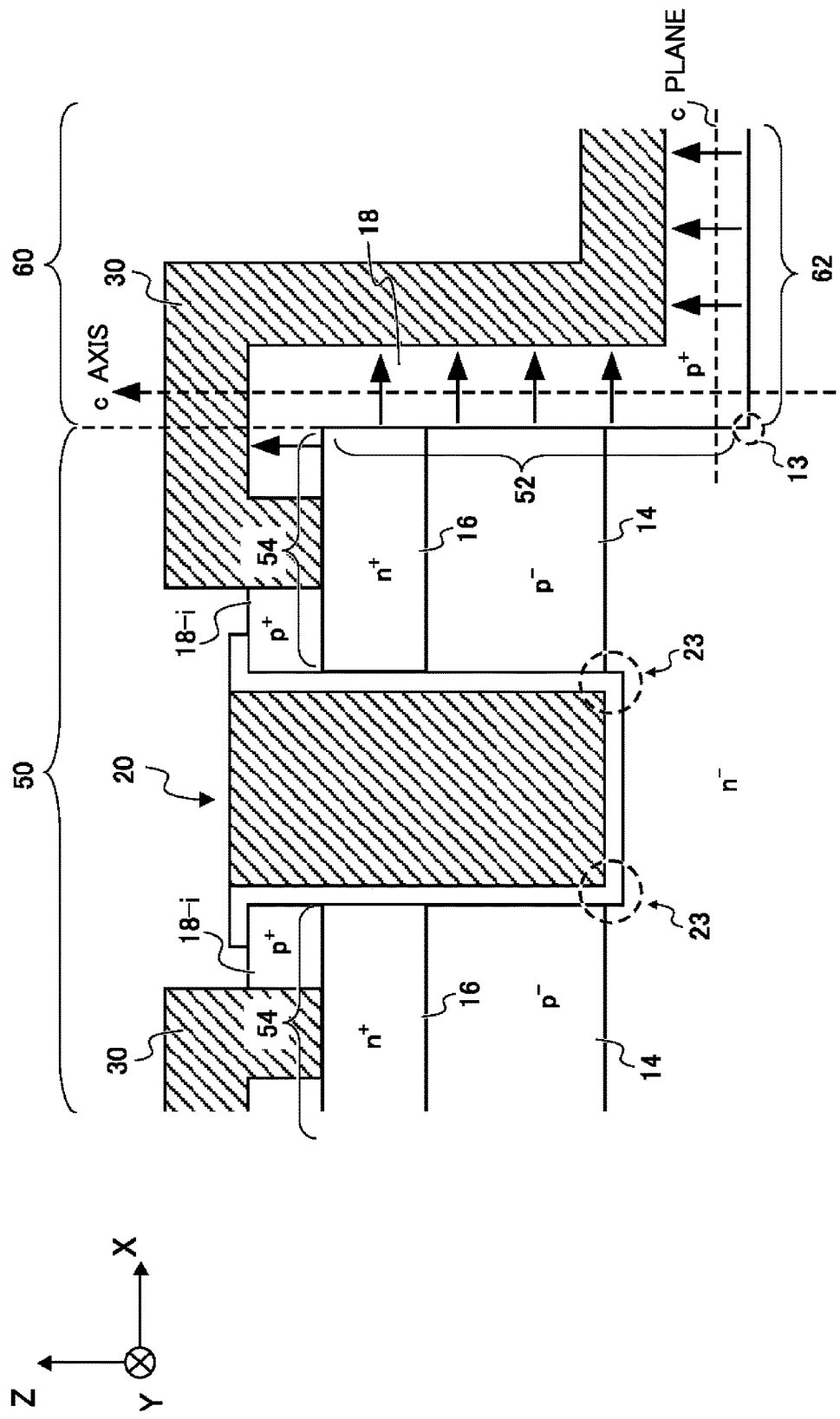
FIG. 9 is an enlarged view of the area near the mesa region 50 in FIG. 6.

FIG. 9 is an enlarged view of the area near the mesa region 50 in FIG. 6. In the same manner as in FIG. 4, the epitaxial formation of the contact layer 18 is indicated by the arrows. In the present example as well, in the same manner as in the first embodiment, the p-type impurity concentration in the contact layer 18 provided in contact with the side portions 52 of the mesa region 50 and the p-type impurity concentration of the contact layer 18 in contact with the bottom portions 62 of the isolation trench portions 60 may be the same. In this way, the depletion layer expands more easily in the X-axis direction of the mesa region 50 than in a comparative example in which the p-type impurity concentration of the side portions 52 is less than the p-type impurity concentration of the bottom portions 62, and therefore it is possible to more reliably prevent the occurrence of insulation breakdown in the corner portions 23 compared to the comparative example. Among the contact layers 18 of FIG. 9, the contact layer 18-$i$ in contact with the side portions of the gate trench portion 20 of the mesa region 50 may be separated from the contact layer 18 to have an isolated island shape in a top view of the semiconductor device 100. The contact layer 18-$i$ with the isolated island shape does not necessarily need to remain, and may be removed.

In the modification of the present example, the p-type impurity concentration of the contact layer 18 provided on the side portions 52 of the mesa region 50 may be higher than the p-type impurity concentration of the contact layer 18 is provided in contact with the bottom portions 62 of the isolation trench portion 60. In this way, the depletion layer expands more easily in the X-axis direction of the mesa region 50 than in the example described above, and therefore it is possible to more reliably protect the corner portions 23 of the gate trench portion 20.

Figure 10:
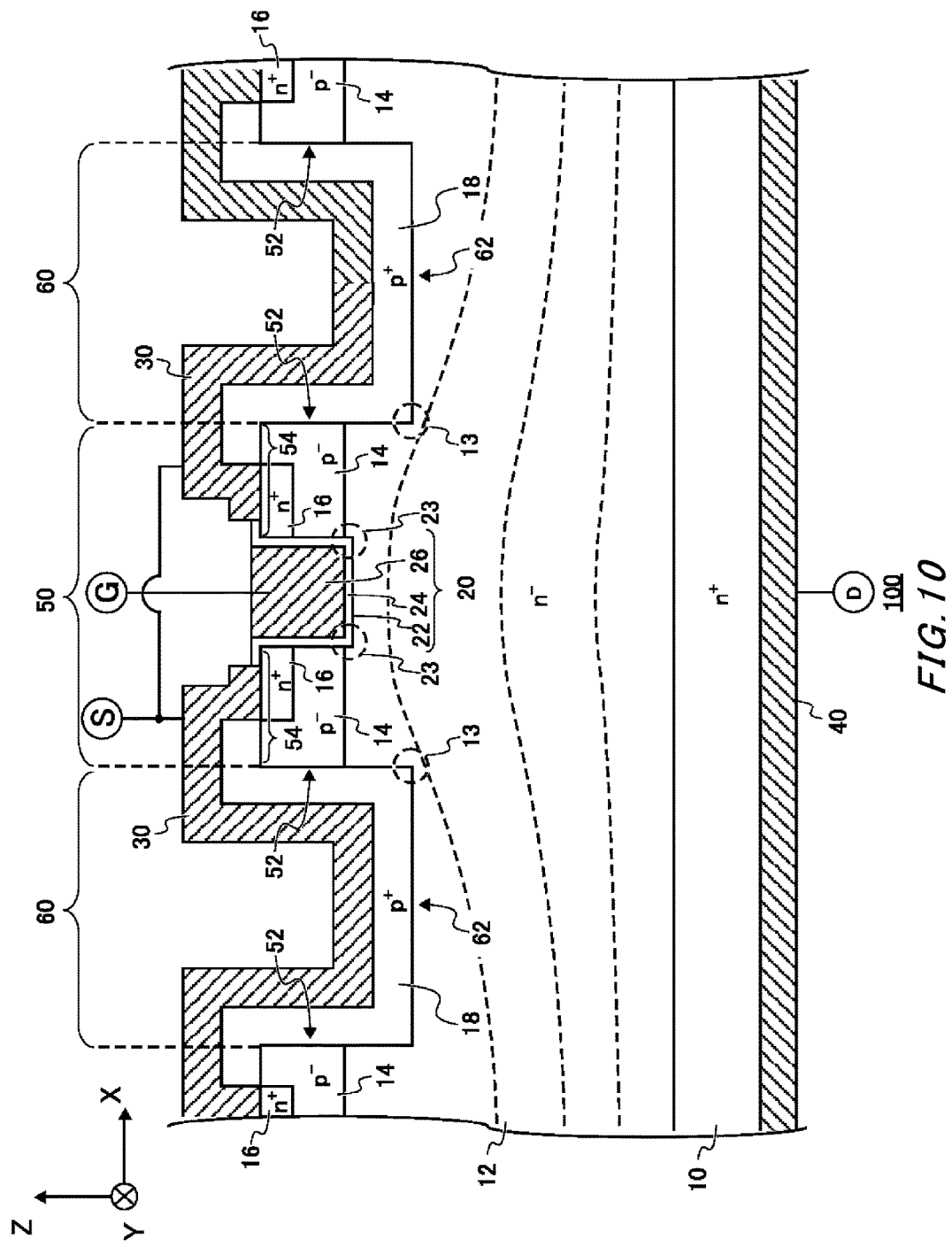
FIG. 10 is a cross-sectional view of the semiconductor device 100 according to a third embodiment.

FIG. 10 is a cross-sectional view of the semiconductor device 100 according to a third embodiment. The source region 16 of the present example is formed using ion implantation, in the same manner as in the first embodiment. However, in the present example, instead of ion-implanting n-type impurities in the p$^+$-type of the contact layer 18 as in the first embodiment, the n-type impurities are ion-implanted in the p$^-$-type base region 14 that has a lower p-type impurity concentration than the contact layer 18. In this way, the n$^+$-type source region 16 is formed in the base region 14.

Therefore, compared to the first embodiment, it is possible to form a higher-quality source region 16. In other words, even with the same conditions for the concentration of the implanted n-type impurities and the thermal treatment time and temperature after the ion implantation, the present example can realize an effectively higher n-type carrier concentration in the source region 16 than the first embodiment.

The contact layer 18 of the present example is provided in contact with the side portions 52 and the top portion 54 of the mesa region 50 and the bottom portions 62 of the isolation trench portion 60. The contact layer 18 of the present example is provided higher than the source region 16. The contact layer 18 of the present example contacts the top portion 54 of the mesa region 50. Furthermore, the contact layer 18 of the present example includes an opening 79, described further below, on the source region 16 and the gate trench portion 20. The source electrode 30 of the present example contacts the source region 16 through the opening 79 of the contact layer 18. The present example differs from the first embodiment mainly with regard to these points. Features of the present example that are shared with the first embodiment can realize the same beneficial effects as in the first embodiment.

Figure 11:
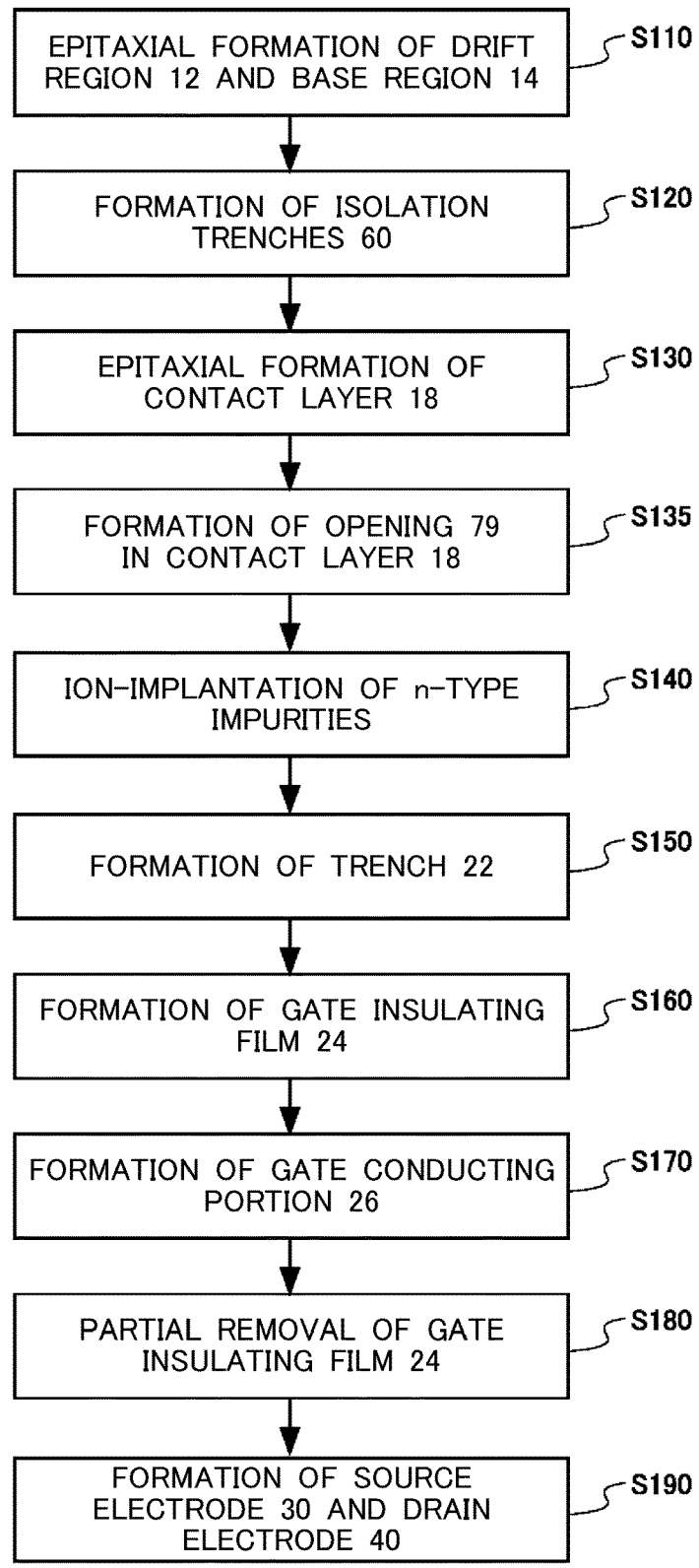
FIG. 11 is a flow chart showing a manufacturing method of the semiconductor device 100 according to the third embodiment.
Figure 12:
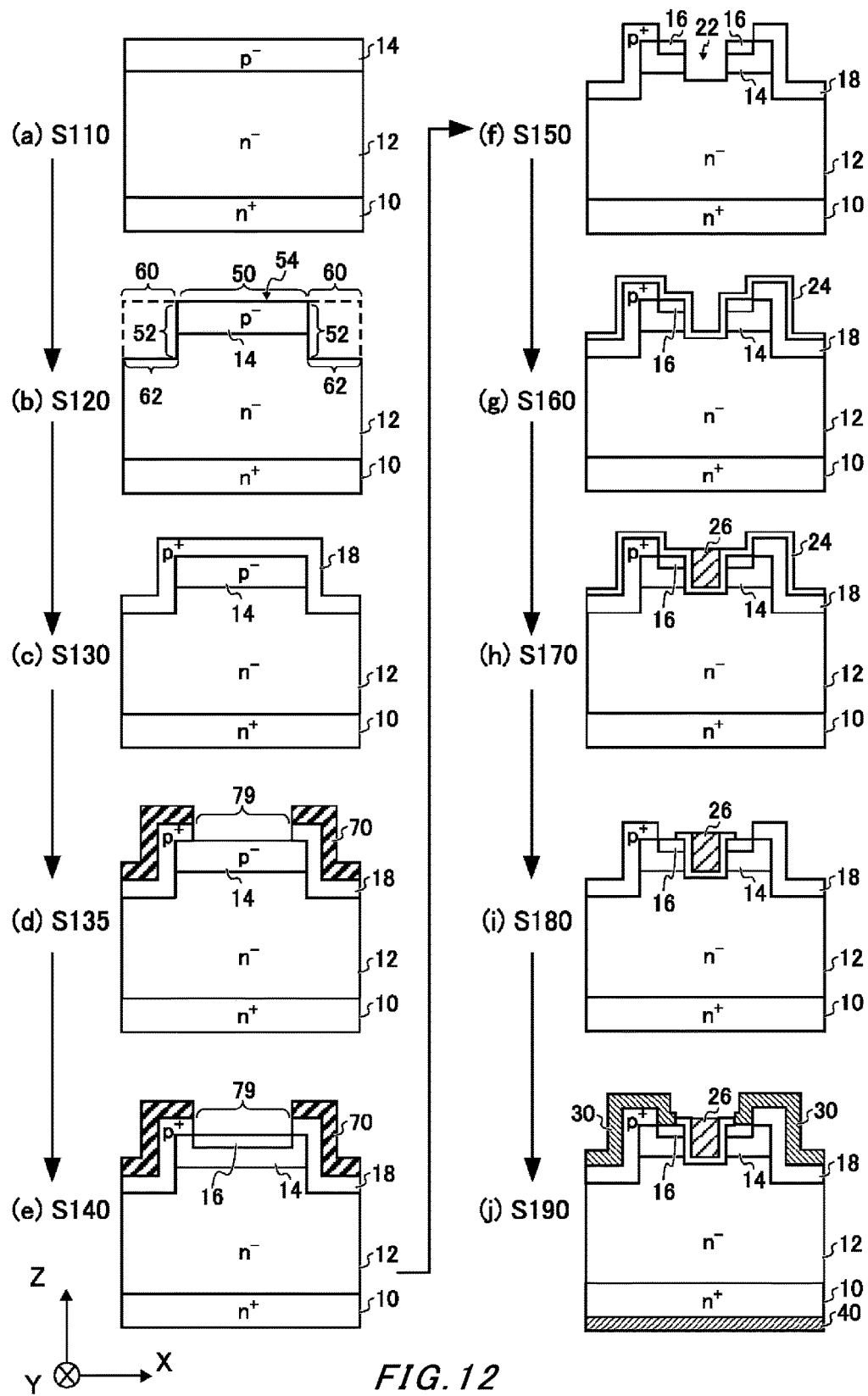
FIG. 12 is a cross-sectional view in which (a) to (j) show the steps of the manufacturing method of the semiconductor device 100 according to the third embodiment.

FIG. 11 is a flow chart showing a manufacturing method of the semiconductor device 100 according to the third embodiment. In the present example, steps are performed in numerical order from step S110 to step S190 (i.e. in order from lower numbers). Steps S110 to S190 correspond respectively to (a) to (j) in FIG. 12 described further below. In the present example, a step of forming the opening 79 in the contact layer 18 is further included between steps S130 and S140 of the first embodiment. In FIG. 12, the description is mainly about these differences with respect to the first embodiment.

FIG. 12 is a cross-sectional view in which (a) to (j) show the steps of the manufacturing method of the semiconductor device 100 according to the third embodiment. In FIG. 12, (a) to (c) are the same as (a) to (c) of FIG. 3. In FIG. 12, (c) may further include a step of thermally treating the substrate being processed that includes the drift region 12, the base region 14, and the contact layer 18, after the step (S130) of epitaxially forming the contact layer 18 and before the step (S140) of ion-implanting the n-type impurities. For example, the substrate being processed is thermally treated at a temperature that is less than or equal to 1100° C. In this way, it is possible to activate the impurities in each region and layer that is epitaxially formed.

In FIG. 12, (d) is a step (S135) of forming the opening 79 in the contact layer 18. In FIG. 12, (d) a photoresist 70 is also shown as the mask material used for etching the contact layer 18. In S135, after the opening with a shape that is the same as or corresponds to the opening 79 is provided in the photoresist 70, the contact layer 18 is etched. In this way, the opening 79 is formed to penetrate through the contact layer 18 and reach the base region 14. In FIG. 12, the photoresist 70 is used in S135 and S140, and therefore the photoresist 70 is explicitly shown. However, it is obvious that a photoresist is used in the photolithography of other embodiments as well.

In FIG. 12, (e) is a step (S140) of ion-implanting the n-type impurities. The n-type impurities may be ion-implanted into the base region 14 via at least the opening 79, after the step (S135) of forming the opening 79 in the contact layer 18 and before the step (S150 to S180) of forming the gate trench portion 20. In step S140 of the present example, the n-type impurities are ion-implanted in the base region 14 via each opening of the photoresist 70 and the contact layer 18.

In the present example, the n-type impurities are ion-implanted in the base region 14 using the opening 79 of the contact layer 18 and the opening of the photoresist 70. The opening 79 of the contact layer 18 and the opening of the photoresist 70 may have a wider range in the X-Y plane in which the gate trench portion 20 is provided. Therefore, in the present example, a fine opening 19 does not need to be formed in the contact layer 18 in order to avoid the gate trench portion 20 on the mesa region 50, as in the second embodiment. The present example has more beneficial manufacturing conditions than the second embodiment, with respect to the alignment of the mask positions and the like.

Furthermore, in the present example, the n-type impurities can be ion-implanted using the contact layer 18 and the photoresist 70, and therefore there is no need for a separate photolithography process for the ion implantation in S140. In this way, in the present example, the process can be simplified compared to a case in which a separate photolithography process for ion implantation is provided.

In the present example, instead of epitaxially forming the source region 16 on the base region 14 as in the second embodiment, the source region 16 is formed by ion-implanting the n-type impurities in the base region 14. There are cases where it is difficult to control the threshold value of the gate voltage caused by the impurities in the base region 14 not being suitably activated when the source region 16 is epitaxially formed on the base region 14 and the thermal treatment is then performed.

For example, if the p-type impurity is Mg, the H in the Mg—H bonds (the bonds between the magnesium atoms and the hydrogen atoms) in the base region 14 break apart, and the Mg remains in the base region 14 while the H escapes from the base region 14. In this way, the Mg in the base region 14 is activated. In contrast to this, when thermal treatment is performed on the substrate being processed in a state where the source region 16 is provided on the base region 14, there are cases where the Mg and H break apart but do not progress sufficiently as a result of a reduction in the amount of H escaping from the base region 14. As a result, there are cases where the p-type impurities in the base region 14 are not suitably activated. In contrast to this, in the present example, the n-type impurities are ion-implanted in the base region 14, and therefore it is possible to suitably activate the impurities in the base region 14 compared to the second embodiment. In this way, it becomes easy to control the threshold value of the gate voltage compared to the second embodiment.

In FIG. 12, (f) to (j) are the same as (e) to (i) in FIG. 3. Therefore, redundant descriptions are omitted.

Figure 13:
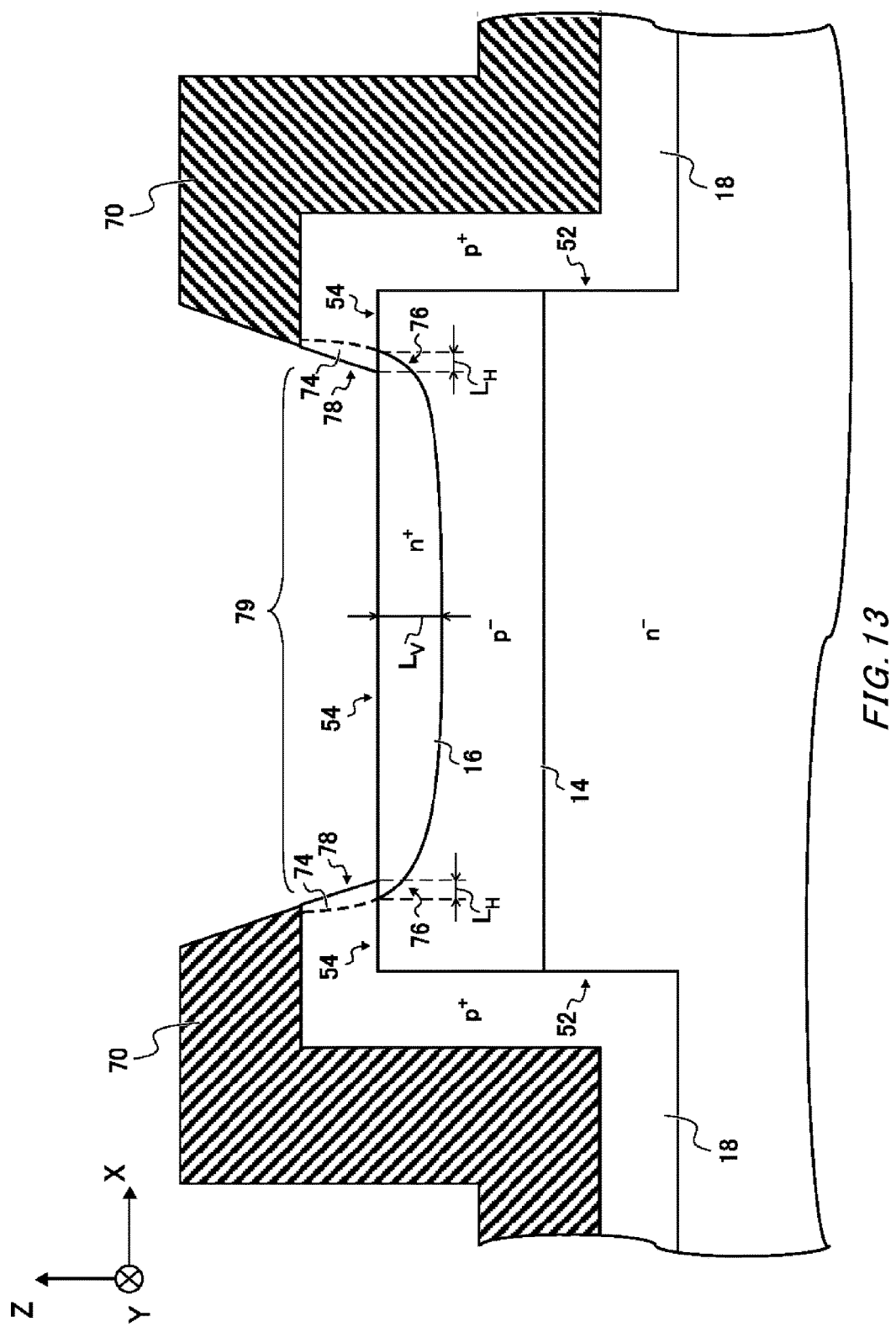
FIG. 13 is an enlarged view of the mesa region 50 in S140.

FIG. 13 is an enlarged view of the mesa region 50 in S140. More specifically, FIG. 13 is an enlarged view of the mesa region 50 in a state after the n-type impurities are ion-implanted in the base region 14 and the substrate being processed is then thermally treated. In a top view of the semiconductor device 100, the end portions 78 of the opening 79 of the contact layer 18 may be positioned on the side end portions 76 of the source region 16. In other words, at least part of the source region 16 may be positioned below the contact layer 18.

In the present example, the end portions 78 are the end portions of the contact layer 18 that form the side surfaces of the opening 79 of the contact layer 18. Furthermore, in the present example, the side end portions 76 of the source region 16 are the end regions of the source region 16 closer to the side portions 52 of the mesa region 50 than a central position of the source region 16 in the X-Y plane in the top view of the semiconductor device 100. The side end portions 76 do not necessarily refer to just the end portions of the source region 16 positioned farthest outward in the X-Y plane. The side end portions 76 may refer to the end regions within a range to a position that is a predetermined length from this end portion along the boundary between the source region 16 and the base region 14.

In the present example, in the top view of the semiconductor device 100, the end portions 78 of the opening 79 of the contact layer 18 and the side end portions 76 of the source region 16 overlap in the depth direction. In the present example, having the end portions 78 and the side end portions 76 overlap in the depth direction means that the positions of the end portions 78 of the opening 79 of the contact layer 18 match the positions of the side end portions 76 of the source region 16. The end portions 78 and the side end portions 76 do not necessarily need to overlap 100% in the depth direction. For example, the end portions 78 and the side end portions 76 overlap by at least a length $L_H$, described further below.

The source region 16 of the present example is provided from the top portion 54 of the mesa region 50 to a position at a prescribed depth in the base region 14. In a cross-sectional view parallel to the depth direction, the source region 16 is provided with a well shape. In FIG. 13, the maximum depth of the source region 16 is $L_V$. The source region 16 may have a flat bottom portion positioned at a depth of $L_V$. In FIG. 13, on the top portion 54 of the mesa region 50, the length of the source region 16 expanding farther outward than the outermost boundary between the top portion 54 of the mesa region 50 and the opening 79 is $L_H$.

The depth $L_V$ may have a length approximately equal to the length $L_H$, or longer than the length $L_H$. The depth $L_V$ of the present example may be greater than or equal to the length $L_H$ ($L_H \leq L_V$). In the present example, the depth $L_V$ has a prescribed length that is greater than or equal to 0.1 [μm] and less than or equal to 0.5 [μm], and the length $L_H$ has a prescribe length that is greater than or equal to 0.1 [μm] and less than or equal to 0.2 [μm]. In the range of the length $L_H$ of the source region 16, the n-type impurities that are ion-implanted are present directly below the opening 79 due to the movement caused by thermal diffusion, and the n-type impurities that have penetrated through the contact layer 18 may be present.

In the present example, due to the n-type impurities being ion-implanted in the base region 14, the n-type impurities are ion-implanted in the end regions 74 of the contact layer 18. The outermost portion where the n-type impurities are ion-implanted in the contact layer 18 is indicated by a dotted line. The end regions 74 may include tapered portions that contact the opening 79 within the contact layer 18. The end regions 74 may have a region that is substantially triangular and includes the tapered portion of the contact layer 18 and a portion where this tapered portion is orthogonally projected onto the top portion 54, and may be regions in which the n-type impurities are ion-implanted in the contact layer 18. The end regions 74 of the present example are a $p^+$-type regions, and therefore do not become inverted to n-type even when the n-type impurities for forming the source region 16 are ion-implanted.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: substrate, 12: drift region, 13: corner portion, 14: base region, 15: expansion region, 16: source region, 18, 18-$i$: contact layer, 19: opening, 20: gate trench portion, 22: trench, 23: corner portion, 24: gate insulating film, 26: gate conducting portion, 30: source electrode, 40: drain electrode, 50: mesa region, 52: side portion, 54: top portion, 60: isolation trench portion, 62: bottom portion, 70: photoresist, 74: end region, 76: side end portion, 78: end portion, 79: opening, 100: semiconductor device.

What is claimed is:

1. A semiconductor device comprising:
   at least two isolation trench portions;
   a mesa region that is provided between the at least two isolation trench portions and includes a source region having a first conduction type, a base region having a second conduction type and at least a portion thereof provided below the source region, and a gate trench portion; and
   a contact layer that is an epitaxial layer provided at least in contact with side portions of the mesa region and bottom portions of the isolation trench portions positioned lower than the gate trench portion, and having a second-conduction-type impurity concentration higher than that of the base region, wherein
   the same impurities as in the contact layer are present in the source region, or the contact layer is provided higher than the source region,
   the mesa region and the contact layer are formed of a GaN-based semiconductor material,
   the contact layer has an opening on the source region,
   the contact layer contacts a top portion of the mesa region, and
   in a top view of the semiconductor device, a position of an end portion of the opening of the contact layer matches a position of a side end portion of the source region.

2. The semiconductor device according to claim 1, wherein
   the same impurities as in the contact layer are present in the source region, and
   the second-conduction-type impurity concentration in the source region and the second-conduction-type impurity concentration in the contact layer provided in contact with the bottom portions of the isolation trench portions are the same.

3. The semiconductor device according to claim 1, wherein
   the base region has a tail region in which the impurity concentration of impurities with a first conduction type, which is the same conduction type as the impurities of the source region, gradually decreases in a depth direction of the gate trench portion.

4. The semiconductor device according to claim 1, wherein
   the contact layer is provided on the source region, and
   the semiconductor device further comprises a source electrode having at least a portion thereof provided on the contact layer that is provided on the mesa region, and penetrating through the contact layer to contact the source region.

5. The semiconductor device according to claim 1, wherein
   the second-conduction-type impurity concentration of the contact layer provided on the side portions of the mesa region and the second-conduction-type impurity concentration of the contact layer provided in contact with the bottom portions of the isolation trench portions are the same.

6. The semiconductor device according to claim 1, wherein
   the second-conduction-type impurity concentration of the contact layer provided on the side portions of the mesa region is higher than the second-conduction-type impurity concentration of the contact layer provided in contact with the bottom portions of the isolation trench portions.

7. The semiconductor device according to claim 1, wherein
   in a top view of the semiconductor device, an end portion of the opening of the contact layer is positioned on a side end portion of the source region.

8. A method of manufacturing a semiconductor device, comprising:
   epitaxially forming a base region with a second conduction type on a drift region with a first conduction type;
   forming a mesa region between at least two isolation trench portions, by partially etching the drift region and the base region;
   epitaxially forming a contact layer that contacts a top portion of the mesa region, side portions of the mesa region, and bottom portions of the isolation trench portions, has an opening on the source region, has a position of an end portion of the opening that matches a position of a side end portion of the source region in a top view of the semiconductor device, and has a second-conduction-type impurity concentration that is higher than that of the base region; and
   forming a gate trench portion.

9. The method of manufacturing the semiconductor device according to claim 8, further comprising:
   ion-implanting impurities with a first conduction type in a predetermined region of the contact layer provided on the top portion of the mesa region, after the epitaxially forming the contact layer and before the forming the gate trench portion.

10. The method of manufacturing the semiconductor device according to claim 8, further comprising:
    epitaxially forming a source region with a first conduction type on the base region, after the epitaxially forming the base region and before the forming the mesa region.

11. A method of manufacturing a semiconductor device, comprising:
    epitaxially forming a base region with a second conduction type on a drift region with a first conduction type;

forming a mesa region between at least two isolation trench portions, by partially etching the drift region and the base region;

epitaxially forming a contact layer that contacts a top portion of the mesa region, side portions of the mesa region, and bottom portions of the isolation trench portions, and has a second-conduction-type impurity concentration that is higher than that of the base region; and forming a gate trench portion, wherein the epitaxially forming the contact layer is performed after the forming the mesa region and before the forming the gate trench portion, and the method of manufacturing the semiconductor device further comprises:

thermally treating the contact layer, after the epitaxially forming the contact layer and before the forming the gate trench portion;

forming an opening in the contact layer, after the thermally treating the contact layer and before the forming the gate trench portion; and ion-implanting impurities with a first conduction type in the base region via at least the opening, after the forming the opening in the contact layer and before the forming the gate trench portion.

12. The semiconductor device according to claim 1, wherein
the base region is provided covering corner portions positioned at bottom ends of side portions of the gate trench portion in contact with the base region.

13. The method of manufacturing the semiconductor device according to claim 8, wherein
the gate trench portion is formed into the base region of the mesa region to a depth such that the base region is provided covering corner portions positioned at bottom ends of side portions of the gate trench portion in contact with the base region.

* * * * *